United States Patent
Choi

(10) Patent No.: US 11,887,919 B2
(45) Date of Patent: Jan. 30, 2024

(54) SEMICONDUCTOR PACKAGE

(71) Applicant: Samsung Electronics Co., Ltd., Suwon-si (KR)

(72) Inventor: Yun Seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 17/181,116

(22) Filed: Feb. 22, 2021

(65) Prior Publication Data

US 2022/0013447 A1    Jan. 13, 2022

(30) Foreign Application Priority Data

Jul. 10, 2020 (KR) .................. 10-2020-0085590

(51) Int. Cl.
*H01L 23/498* (2006.01)
*H01L 25/065* (2023.01)
(Continued)

(52) U.S. Cl.
CPC ...... *H01L 23/49827* (2013.01); *H01L 21/486* (2013.01); *H01L 21/4853* (2013.01);
(Continued)

(58) Field of Classification Search
CPC ....... H01L 23/562; H01L 23/538–5389; H01L 23/14; H01L 23/49894; H01L 23/49827; H01L 21/4853; H01L 21/486; H01L 23/49811; H01L 25/0655; H01L 25/18; H01L 23/147; H01L 23/3675; H01L 24/73; H01L 2224/73204; H01L 25/0657;
(Continued)

(56) References Cited

U.S. PATENT DOCUMENTS 6,399,892 B1   6/2002   Milkovich et al.
7,550,321 B2   6/2009   Palanduz
(Continued)

FOREIGN PATENT DOCUMENTS

JP   2017123424 A   7/2017
JP   2018098463 A   6/2018
(Continued)

*Primary Examiner* — Selim U Ahmed
*Assistant Examiner* — Evan G Clinton
(74) *Attorney, Agent, or Firm* — Muir Patent Law, PLLC

(57) ABSTRACT

A semiconductor package includes an upper substrate having a first surface and a second surface which are opposite to each other, a semiconductor chip on the first surface of the upper substrate, a buffer layer on the second surface of the upper substrate, a mold layer between the second surface of the upper substrate and the buffer layer, a plurality of through-electrodes penetrating the upper substrate and the mold layer, an interconnection layer between the first surface of the upper substrate and the semiconductor chip and configured to electrically connect the semiconductor chip to the plurality of through-electrodes, and a plurality of bumps disposed on the buffer layer, spaced apart from the mold layer, and electrically connected to the plurality of through-electrodes. The mold layer includes an insulating material of which a coefficient of thermal expansion is greater than that of the upper substrate.

19 Claims, 21 Drawing Sheets

(51) Int. Cl.
*H01L 25/18* (2023.01)
*H01L 21/48* (2006.01)
*H01L 23/367* (2006.01)
*H01L 23/14* (2006.01)
*H01L 23/00* (2006.01)

(52) U.S. Cl.
CPC .. *H01L 23/49811* (2013.01); *H01L 23/49894* (2013.01); *H01L 25/0655* (2013.01); *H01L 25/18* (2013.01); *H01L 23/147* (2013.01); *H01L 23/3675* (2013.01); *H01L 24/73* (2013.01); *H01L 2224/73204* (2013.01)

(58) Field of Classification Search
CPC ......... H01L 24/13; H01L 24/16; H01L 24/29; H01L 24/32; H01L 2224/16235; H01L 2224/73253; H01L 2924/15192; H01L 2924/16152; H01L 2924/181; H01L 23/145; H01L 23/3128; H01L 23/42; H01L 2224/16146; H01L 23/49833; H01L 23/49816; H01L 2225/06513; H01L 2225/06517; H01L 2225/06524; H01L 2225/06541; H01L 2924/15311; H01L 2924/18161; H01L 25/072; H01L 23/49838; H01L 23/31; H01L 23/29; H01L 23/367; H01L 23/481; H01L 23/485; H01L 23/5226; H01L 23/525; H01L 23/5386; H05K 1/185
See application file for complete search history.

(56) References Cited

U.S. PATENT DOCUMENTS

| | | | |
|---|---|---|---|
| 8,866,301 B2 | 10/2014 | Lin et al. | |
| 8,994,193 B2 | 3/2015 | Tateiwa et al. | |
| 9,478,504 B1* | 10/2016 | Shen | H01L 23/49838 |
| 9,508,699 B2 | 11/2016 | Kim et al. | |
| 9,583,431 B1 | 2/2017 | Rahman et al. | |
| 9,780,043 B2 | 10/2017 | Kaneda et al. | |
| 2015/0303181 A1* | 10/2015 | Kim | H01L 23/13 |
| | | | 257/774 |
| 2016/0035666 A1* | 2/2016 | Huang | H01L 21/481 |
| | | | 438/118 |
| 2017/0330836 A1 | 11/2017 | Vanhille et al. | |
| 2018/0096974 A1* | 4/2018 | Lin | H01L 25/105 |
| 2021/0193542 A1* | 6/2021 | Chang | H01L 23/49822 |

FOREIGN PATENT DOCUMENTS

| | | |
|---|---|---|
| TW | 202008546 A | 2/2020 |
| TW | 201926585 B | 9/2020 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0085590, filed on Jul. 10, 2020, in the Korean Intellectual Property Office, the disclosure of which is hereby incorporated by reference in its entirety.

BACKGROUND

Embodiments of the inventive concepts relate to a semiconductor package and, more particularly, to a semiconductor package in which a plurality of semiconductor chips are mounted.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. Small, lightweight and multi-functional electronic devices have been demanded with the development of the electronic industry, and thus a multi-chip package and/or a system-in package have been suggested. The multi-chip package may be a single semiconductor package in which chips are stacked, and the system-in package may be a single semiconductor package in which different kinds of chips are mounted to operate as a system.

SUMMARY

Embodiments of the inventive concepts may provide a semiconductor package capable of easily controlling warpage.

Embodiments of the inventive concepts may also provide a semiconductor package with excellent reliability.

According to an exemplary embodiment of the present invention, a semiconductor package includes an upper substrate having a first surface and a second surface which are opposite to each other, a semiconductor chip on the first surface of the upper substrate, a buffer layer on the second surface of the upper substrate, a mold layer between the second surface of the upper substrate and the buffer layer, a plurality of through-electrodes penetrating the upper substrate and the mold layer, an interconnection layer between the first surface of the upper substrate and the semiconductor chip and configured to electrically connect the semiconductor chip to the plurality of through-electrodes, and a plurality of bumps disposed on the buffer layer, spaced apart from the mold layer, and electrically connected to the plurality of through-electrodes. The mold layer includes an insulating material of which a coefficient of thermal expansion is greater than that of the upper substrate.

According to an exemplary embodiment of the present invention, a semiconductor package includes an upper substrate having a first surface and a second surface which are opposite to each other, a plurality of semiconductor chips on the first surface of the upper substrate, a mold layer on the second surface of the upper substrate, the mold layer including a material of which a coefficient of thermal expansion is greater than that of the upper substrate, a plurality of first through-electrodes penetrating the upper substrate, and a plurality of second through-electrodes penetrating the mold layer. Each of the plurality of first through-electrodes is connected to a corresponding one of the plurality of second through-electrodes. Each of the first plurality of through-electrodes has a first width in a first direction parallel to the first surface of the upper substrate. Each of the second plurality of through-electrodes has a second width in the first direction, the second width being greater than the first width.

According to an exemplary embodiment of the present invention, a semiconductor package includes an upper substrate on a lower substrate, a plurality of semiconductor chips mounted on the upper substrate, an interconnection layer between the upper substrate and the plurality of semiconductor chips, the plurality of semiconductor chips being connected to a plurality of metal interconnection lines in the interconnection layer, a mold layer between the upper substrate and the lower substrate, a buffer layer between the mold layer and the lower substrate, wherein the buffer layer includes a first surface that is in contact with the mold layer and a second surface opposite to the first surface of the buffer layer, a plurality of bumps disposed between the mold layer and the lower substrate and connected to the lower substrate, and a plurality of through-electrodes penetrating the upper substrate and the mold layer. Each of the plurality of bumps includes a head portion and a pillar portion. The pillar portion extends from the head portion into the buffer layer and is connected to a corresponding through-electrode of the plurality of through-electrodes. The head portion is connected to the pillar portion and is disposed on the second surface of the buffer layer. The mold layer includes an insulating material of which a coefficient of thermal expansion is greater than that of the upper substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

Figure 1:
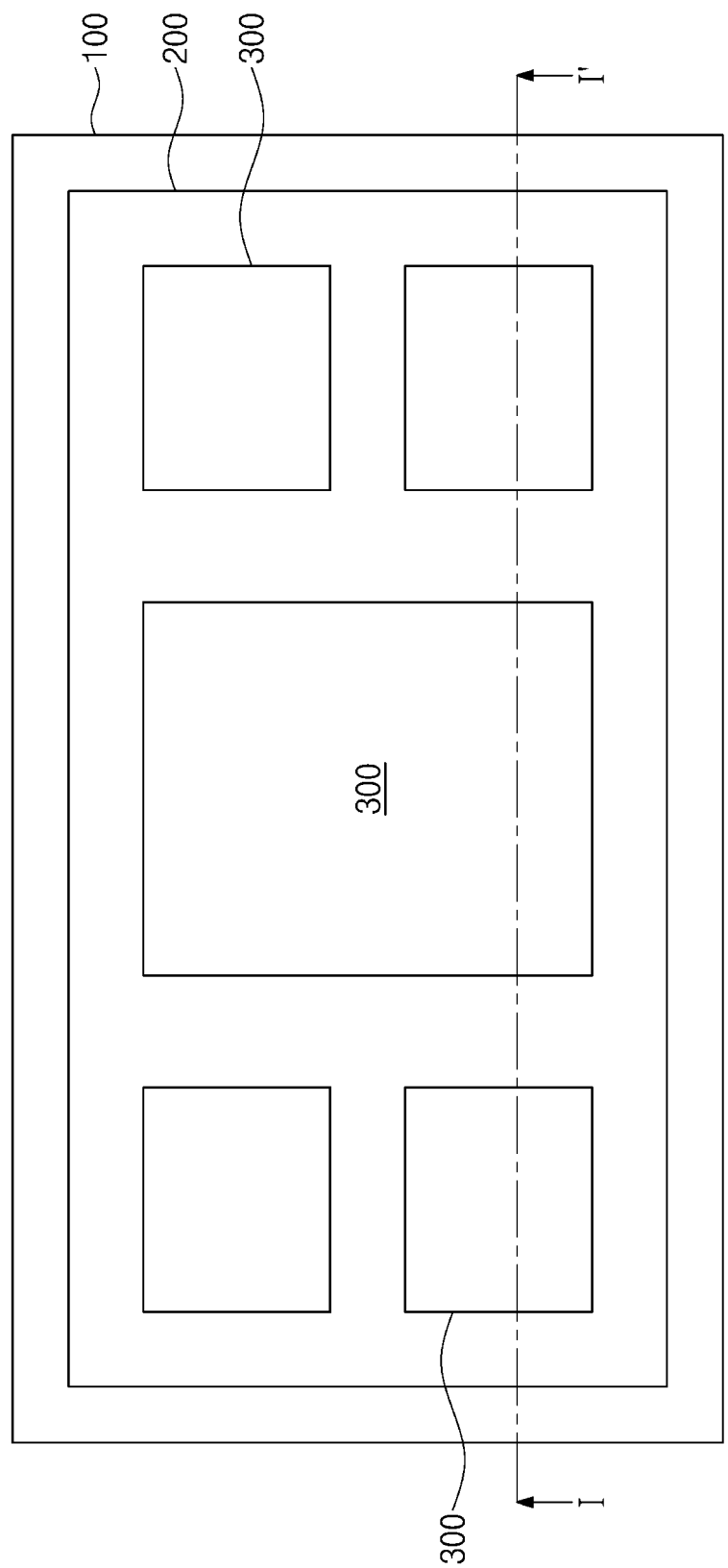
FIG. 1 is a plan view illustrating a semiconductor package according to some embodiments of the inventive concepts.
Figure 2:
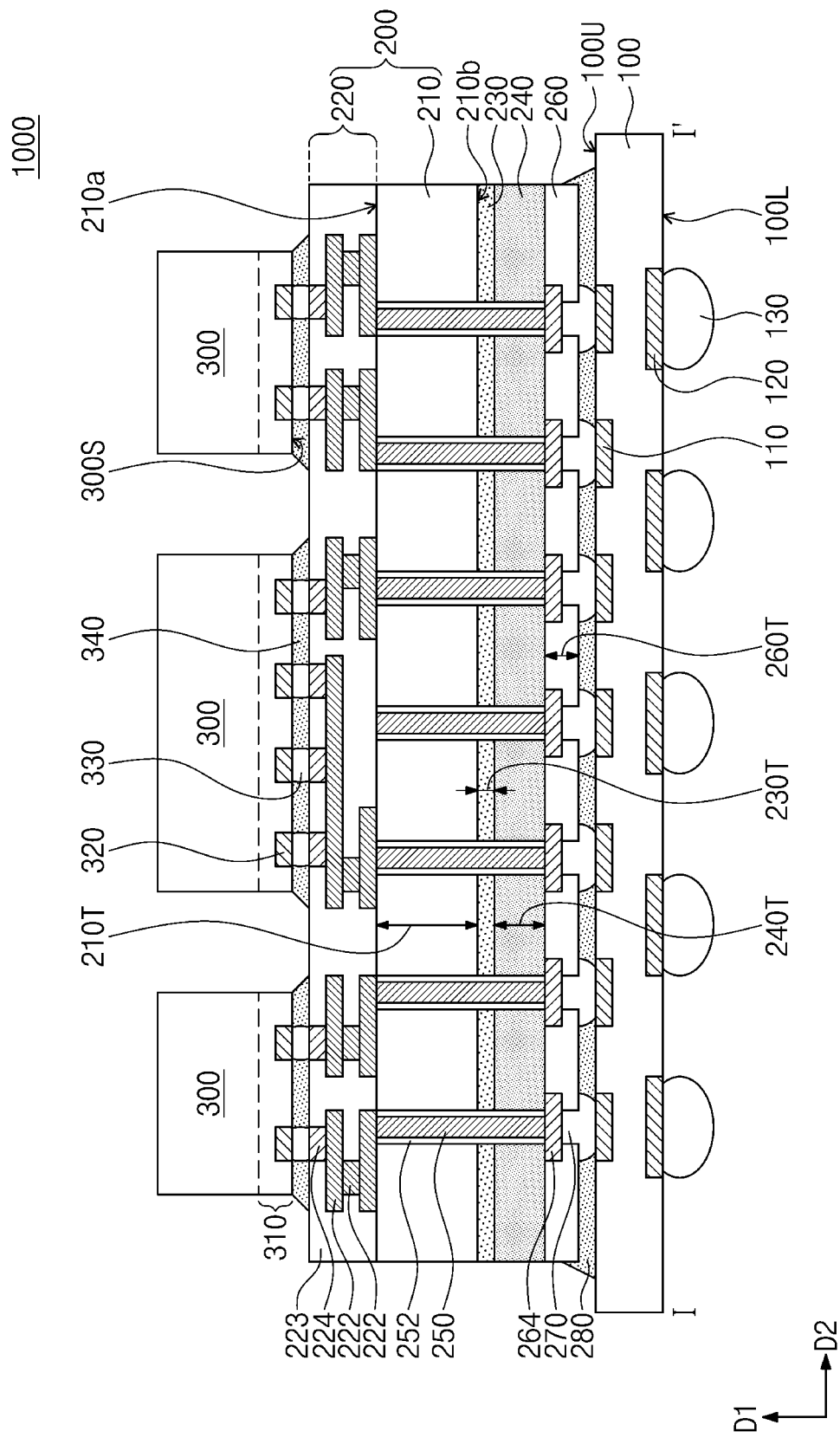
FIG. 2 is a cross-sectional view taken along a line I-I' of FIG. 1.

FIG. 1 is a plan view illustrating a semiconductor package according to some embodiments of the inventive concepts. FIG. 2 is a cross-sectional view taken along a line I-I' of FIG. 1.

Referring to FIGS. 1 and 2, a semiconductor package 1000 may include a lower substrate 100, an upper substrate 210 on the lower substrate 100, a mold layer 240 between the lower substrate 100 and the upper substrate 210, a buffer layer 260 between the lower substrate 100 and the mold layer 240, a plurality of semiconductor chips 300 disposed on the upper substrate 210, and an interconnection layer 220 disposed between the upper substrate 210 and the plurality of semiconductor chips 300.

The upper substrate 210 may have a first surface 210a and a second surface 210b which are opposite to each other. The upper substrate 210 may be disposed on the lower substrate 100 in such a way that the second surface 210b of the upper substrate 210 faces a top surface 100U of the lower substrate 100. The plurality of semiconductor chips 300 may be disposed on the first surface 210a of the upper substrate 210, and the interconnection layer 220 may be disposed between the first surface 210a of the upper substrate 210 and the plurality of semiconductor chips 300. The buffer layer 260 may be disposed between the second surface 210b of the upper substrate 210 and the lower substrate 100, and the mold layer 240 may be disposed between the second surface 210b of the upper substrate 210 and the buffer layer 260. In an exemplary embodiment, the buffer layer 260 may include a first surface that is in contact with the mold layer 240 and a second surface that is opposite to the first surface of the buffer layer 260. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The upper substrate 210 and the interconnection layer 220 may be referred to as an interposer substrate 200. The interconnection layer 220 may include metal interconnection lines 222 disposed on the first surface 210a of the upper substrate 210, first conductive pads 224 on the metal interconnection lines 222, and an interconnection insulating layer 223 covering the metal interconnection lines 222 and the first conductive pads 224. Uppermost metal interconnection lines 222 of the metal interconnection lines 222 may be connected to the first conductive pads 224, and the interconnection insulating layer 223 may expose top surfaces of the first conductive pads 224.

The upper substrate 210 may be, for example, a silicon substrate. A plurality of through-electrodes 250 may be disposed in the upper substrate 210 and may be connected to lowermost metal interconnection lines 222 of the metal interconnection lines 222. Each of the plurality of through-electrodes 250 may penetrate the upper substrate 210 and may be connected to a corresponding one of the metal interconnection lines 222. Each of the plurality of through-electrodes 250 may extend into the mold layer 240 to penetrate the mold layer 240. The plurality of through-electrodes 250 may include a conductive material (e.g., copper (Cu)). An insulating liner 252 may be disposed between the upper substrate 210 and each of the plurality of through-electrodes 250. In some embodiments, the insulating liner 252 may extend between the mold layer 240 and each of the plurality of through-electrodes 250. The insulating liner 252 may include an insulating material.

In some embodiments, an insulating layer 230 may be disposed between the second surface 210b of the upper substrate 210 and the mold layer 240. For example, the insulating layer 230 may include silicon oxide and/or silicon nitride. Each of the plurality of through-electrodes 250 may penetrate the insulating layer 230 and may extend into the mold layer 240. The insulating liner 252 may extend between the insulating layer 230 and each of the plurality of through-electrodes 250.

The mold layer 240 may be or may include an insulating material of which a coefficient of thermal expansion is greater than that of the upper substrate 210. The mold layer 240 may include fillers (e.g., silica). For example, the mold layer 240 may include an epoxy molding compound (EMC) including the fillers (e.g., silica). The mold layer 240 may cover a portion of a sidewall of each of the plurality of through-electrodes 250. In some embodiments, the insulating liner 252 may be disposed between the mold layer 240 and the sidewall of each of the plurality of through-electrodes 250.

Each of the upper substrate 210 and the mold layer 240 may have a thickness in a first direction D1 perpendicular to the first surface 210a of the upper substrate 210. A thickness 240T of the mold layer 240 may be less than a thickness 210T of the upper substrate 210. For example, the thickness 210T of the upper substrate 210 may have a value in a range from about 30 μm to about 110 and the thickness 240T of the mold layer 240 may have a value in a range from about 5 μm to about 100 μm. The insulating layer 230 may have a thickness 230T in the first direction D1, and the thickness 230T of the insulating layer 230 may be less than the thickness 240T of the mold layer 240. For example, the thickness 230T of the insulating layer 230 may have a value in a range from about 1 μm to about 2 The interconnection layer 220 may have a thickness in the first direction D1. For example, the thickness of the interconnection layer 220 may have a value in a range from about 10 μm to about 20 Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

For example, the buffer layer 260 may include a photo-sensitive insulating material (e.g., a photo imageable dielectric (PID)). The buffer layer 260 may have a thickness 260T in the first direction D1, and the thickness 260T of the buffer layer 260 may be less than the thickness 240T of the mold layer 240. The thickness 230T of the insulating layer 230 may be less than the thickness 260T of the buffer layer 260. For example, the thickness 260T of the buffer layer 260 may have a value in a range from about 3 µm to about 7 µm.

In some embodiments, second conductive pads 264 may be disposed between the mold layer 240 and the buffer layer 260. In an exemplary embodiment, the second conductive pads 264 may be buried in the buffer layer 260 and adjacent to the first surface of the buffer layer 260. Each of the plurality of through-electrodes 250 may penetrate the mold layer 240 so as to be connected to a corresponding one of the second conductive pads 264. In some embodiments, sizes (or a pitch) of the second conductive pads 264 may be greater than sizes (or a pitch) of the first conductive pads 224. The buffer layer 260 may cover the second conductive pads 264 and may extend between the second conductive pads 264 so as to be in contact with the mold layer 240.

A plurality of bumps 270 may be disposed between the lower substrate 100 and the buffer layer 260. The plurality of bumps 270 may be disposed on the buffer layer 260 and may be spaced apart from the mold layer 240. In some embodiments, each of the plurality of bumps 270 may extend into the buffer layer 260 and may be connected to a corresponding one of the second conductive pads 264. Each of the plurality of bumps 270 may be electrically connected to a corresponding one of the plurality of through-electrodes 250 through the corresponding second conductive pad 264. Each of the plurality of bumps 270 may include a conductive material and may have at least one of a solder ball shape, a bump shape, or a pillar shape. In an exemplary embodiment, each of the plurality of bumps 270 may include a head portion and a pillar portion. The pillar portion of each bump 270 may extend from the head portion into the buffer layer 260 to be in contact with the corresponding second conductive pad 264. The head portion of each bump 270 may be connected to the pillar portion thereof, and may be disposed on the second surface of the buffer layer 260.

The lower substrate 100 may include first lower substrate pads 110 adjacent to the top surface 100U of the lower substrate 100, and second lower substrate pads 120 adjacent to a bottom surface 100L of the lower substrate 100. The first and second lower substrate pads 110 and 120 may include a conductive material. In some embodiments, the lower substrate 100 may be a printed circuit board (PCB). External terminals 130 may be disposed on the bottom surface 100L of the lower substrate 100 and may be connected to the second lower substrate pads 120, respectively. The plurality of bumps 270 may be connected to corresponding ones of the first lower substrate pads 110, respectively. The first lower substrate pads 110 may be electrically connected to the second lower substrate pads 120 through internal interconnection lines (not shown) provided in the lower substrate 100.

A lower underfill layer 280 may be disposed between the lower substrate 100 and the buffer layer 260 and may fill a space between the plurality of bumps 270. The lower underfill layer 280 may include an insulating polymer material such as an epoxy resin.

The plurality of semiconductor chips 300 may be disposed on the interconnection layer 220 on the first surface 210a of the upper substrate 210. The plurality of semiconductor chips 300 may be horizontally spaced apart from each other on the interconnection layer 220 in a second direction D2 parallel to the first surface 210a of the upper substrate 210. A first surface 300S of each of the plurality of semiconductor chips 300 may face the first surface 210a of the upper substrate 210. Each of the plurality of semiconductor chips 300 may include a circuit layer 310 adjacent to the first surface 300S of each of the plurality of semiconductor chips 300. The circuit layer 310 may include a plurality of transistors to form integrated circuits.

Each of the plurality of semiconductor chips 300 may include chip pads 320 adjacent to the first surface 300S of each of the plurality of semiconductor chips 300. The chip pads 320 may include a conductive material. The chip pads 320 may be connected to corresponding ones of the first conductive pads 224. In some embodiments, connection bumps 330 may be disposed between the chip pads 320 and the first conductive pads 224. Each of the chip pads 320 may be connected to a corresponding first conductive pad 224 through a corresponding one of the connection bumps 330. Each of the connection bumps 330 may include a conductive material and may have at least one of a solder ball shape, a bump shape, or a pillar shape.

In some embodiments, an upper underfill layer 340 may be disposed between the interconnection layer 220 and the first surface 300S of each of the plurality of semiconductor chips 300. The upper underfill layer 340 may be locally disposed on the first surface 300S of each of the plurality of semiconductor chips 300 and may fill a space between the connection bumps 330. The upper underfill layer 340 may include an insulating polymer material such as an epoxy resin. In certain embodiments, the connection bumps 330 and the upper underfill layer 340 may be omitted unlike FIG. 2. The chip pads 320 may be in contact with and bonded directly to the corresponding first conductive pads 224.

In some embodiments, the plurality of semiconductor chips 300 may be the same kind of semiconductor chips. For example, the plurality of semiconductor chips 300 may correspond to memory chips, logic chips, application processor (AP) chips, or system-on-chips (SOCs). In certain embodiments, the plurality of semiconductor chips 300 may include different kinds of semiconductor chips from each other. For example, the plurality of semiconductor chips 300 may include different semiconductor chips selected from a group consisting of a memory chip, a logic chip, an application processor (AP) chip, and a system-on-chip (SOC). In certain embodiments, at least one of the plurality of semiconductor chips 300 may be a high bandwidth memory (HBM) chip which includes a plurality of memory chips stacked in the first direction D1 perpendicular to the first surface 210a of the upper substrate 210.

Each of the plurality of semiconductor chips 300 may be electrically connected to the metal interconnection lines 222 through the chip pads 320, corresponding connection bumps 330 and corresponding first conductive pads 224. Each of the plurality of semiconductor chips 300 may be electrically connected to the lower substrate 100 through corresponding metal interconnection lines 222 and corresponding through-electrodes 250. The plurality of semiconductor chips 300 may be electrically connected to each other through the metal interconnection lines 222 in the interconnection layer 220.

When the metal interconnection lines 222 are disposed in the interconnection layer 220 and the through-electrodes 250 are disposed in the upper substrate 210, warpage of the interposer substrate 200 may occur by structural imbalance between the metal interconnection lines 222 and the through-electrodes 250. For example, a distribution pattern of the through-electrodes 250 and a distribution pattern of the metal interconnection lines 222 may be different from each other, and such difference in the distribution patterns may cause warpage of the interposer substrate 200.

According to the embodiments of the inventive concepts, the interconnection layer 220 may be disposed on the first surface 210a of the upper substrate 210, and the mold layer 240 may be disposed on the second surface 210b of the upper substrate 210. The mold layer 240 may include the insulating material of which the coefficient of thermal expansion is greater than that of the upper substrate 210, and thus the warpage of the interposer substrate 200 may be reduced. The mold layer 240 may include the fillers (e.g., silica). The coefficient of thermal expansion of the mold layer 240 may be adjusted according to the amount of the fillers in the mold layer 240. Therefore, the warpage of the interposer substrate 200 may be easily adjusted.

Furthermore, the buffer layer 260 may be disposed on the second surface 210b of the upper substrate 210, and the mold layer 240 may be disposed between the second surface 210b of the upper substrate 210 and the buffer layer 260. The plurality of bumps 270 may be disposed on the buffer layer 260 so as to be spaced apart from the mold layer 240. The buffer layer 260 may reduce stress applied to the plurality of bumps 270.

As a result, the warpage may be easily controlled, and a semiconductor package with excellent reliability may be provided.

FIGS. 3 to 8 are cross-sectional views corresponding to the line I-I' of FIG. 1 to illustrate a method of manufacturing a semiconductor package, according to some embodiments of the inventive concepts. Hereinafter, the descriptions to the same features as in the semiconductor package 1000 mentioned with reference to FIGS. 1 and 2 will be omitted for the purpose of ease and convenience in explanation.

Figure 3:
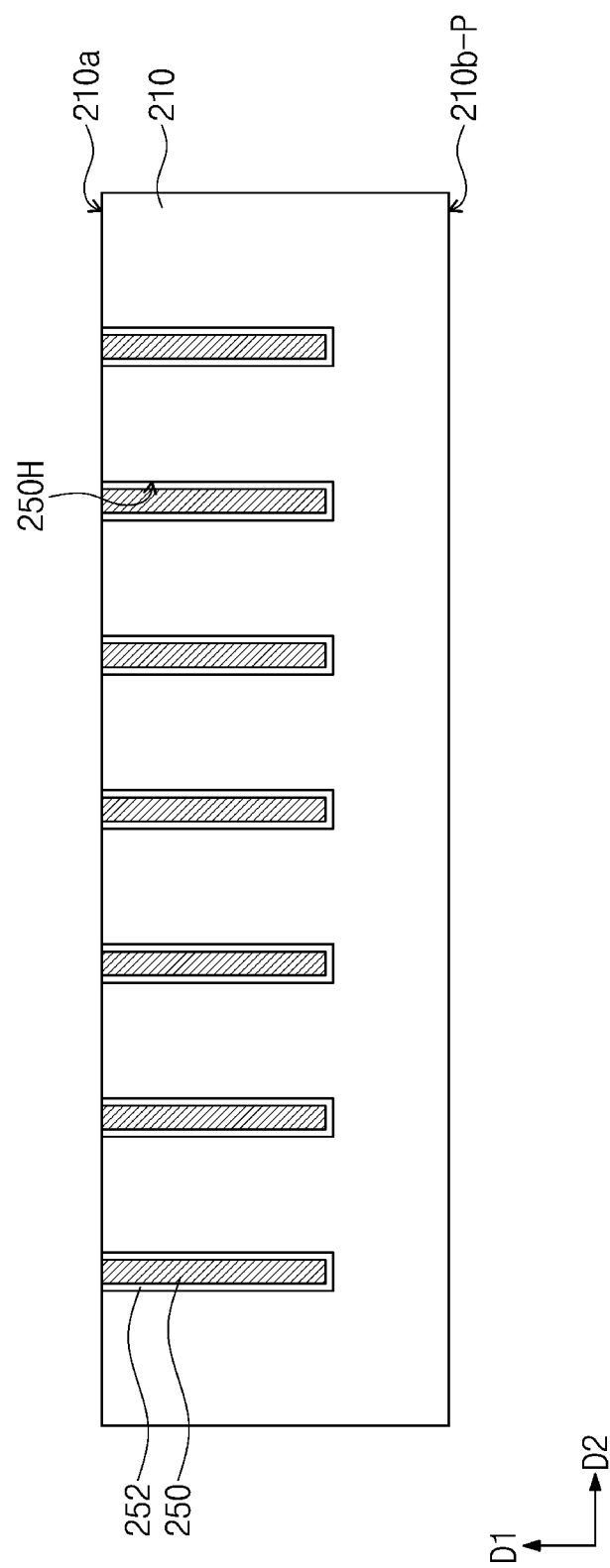
FIGS. 3 to 8 are cross-sectional views corresponding to the line I-I' of FIG. 1 to illustrate a method of manufacturing a semiconductor package, according to some embodiments of the inventive concepts.

Referring to FIG. 3, a plurality of through-electrodes 250 and a plurality of insulating liners 252 may be formed in an upper substrate 210. For example, the formation of the plurality of through-electrodes 250 and the plurality of insulating liners 252 may include forming through-holes 250H penetrating a portion of the upper substrate 210, forming an insulating liner layer filling a portion of each of the through-holes 250H on a first surface 210a of the upper substrate 210, forming an electrode layer filling a remaining portion of each of the through-holes 250H on the insulating liner layer, and planarizing the electrode layer and the insulating liner layer to expose the first surface 210a of the upper substrate 210. Each of the through-holes 250H may extend from the first surface 210a of the upper substrate 210 toward a preliminary second surface 210b-P of the upper substrate 210 and may be spaced apart from the second surface 210b of the upper substrate 210. The plurality of through-electrodes 250 and the plurality of insulating liners 252 may be locally formed in the through-holes 250H by the planarization process. Each of the plurality of insulating liners 252 may be disposed between the upper substrate 210 and each of the plurality of through-electrodes 250.

Figure 4:
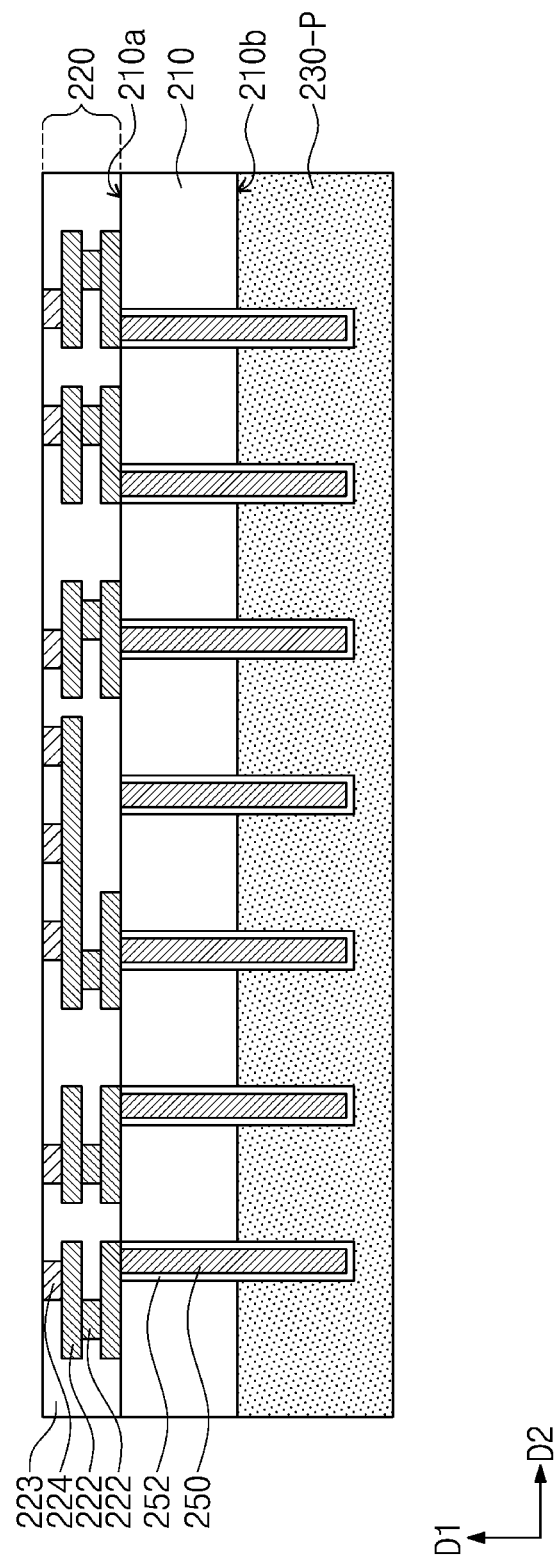

Referring to FIG. 4, an interconnection layer 220 may be formed on the first surface 210a of the upper substrate 210. The formation of the interconnection layer 220 may include forming metal interconnection lines 222 on the first surface 210a of the upper substrate 210, forming first conductive pads 224 on the metal interconnection lines 222, and forming an interconnection insulating layer 223 covering the metal interconnection lines 222 and the first conductive pads 224.

A first etching process may be performed on the preliminary second surface 210b-P of the upper substrate 210. A portion of the upper substrate 210 may be selectively etched by the first etching process, and thus a portion of each of the plurality of through-electrodes 250 and a portion of each of the plurality of insulating liners 252 may protrude from a second surface 210b of the upper substrate 210. In some embodiments, a preliminary insulating layer 230-P may be formed on the second surface 210b of the upper substrate 210 and may cover the protruding portion of each of the plurality of through-electrodes 250 and the protruding portion of each of the plurality of insulating liners 252. The insulating layer 230 may be formed using, for example, a chemical vapor deposition (CVD) process.

Figure 5:
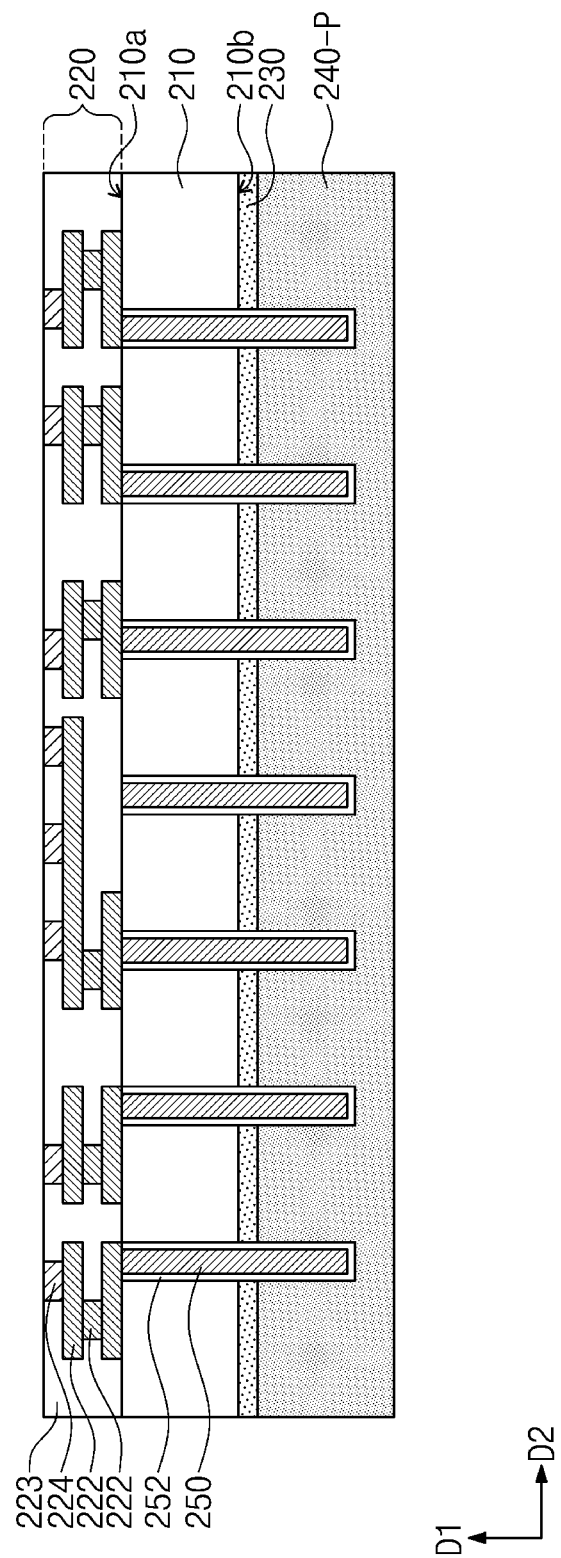

Referring to FIG. 5, a second etching process may be performed on the second surface 210b of the upper substrate 210. A portion of the preliminary insulating layer 230-P may be selectively etched by the second etching process, and thus a portion of each of the plurality of through-electrodes 250 and a portion of each of the plurality of insulating liners 252 may protrude from an insulating layer 230. In certain embodiments, the formation of the insulating layer 230 and the second etching process may be omitted unlike the drawings.

A preliminary mold layer 240-P may be formed on the second surface 210b of the upper substrate 210 and may cover the insulating layer 230, the protruding portion of each of the plurality of through-electrodes 250, and the protruding portion of each of the plurality of insulating liners 252. The mold layer 240 may be formed of an insulating material having a greater coefficient of thermal expansion than that of the upper substrate 210 and may include fillers (e.g., silica).

Figure 6:
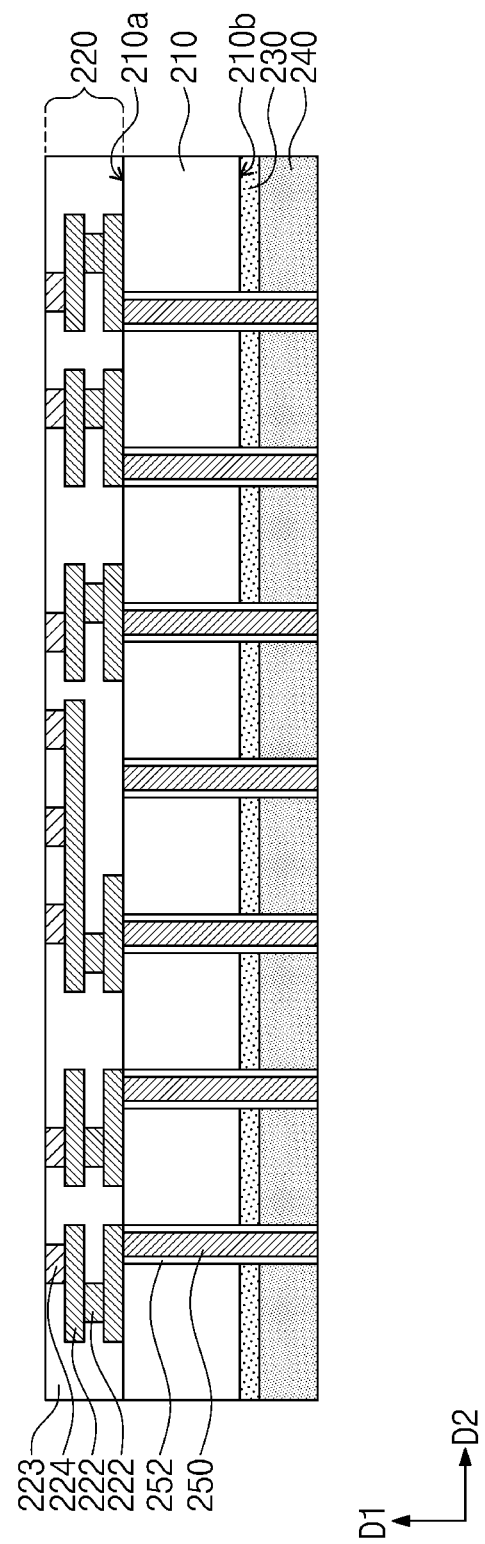

Referring to FIG. 6, a grinding process may be performed on the preliminary mold layer 240-P. A portion of the preliminary mold layer 240-P, a portion of each of the plurality of through-electrodes 250 and a portion of each of the plurality of insulating liners 252 may be removed by the grinding process. Thus, an end of each of the plurality of through-electrodes 250 and an end of each of the plurality of insulating liners 252 may be exposed.

Figure 7:
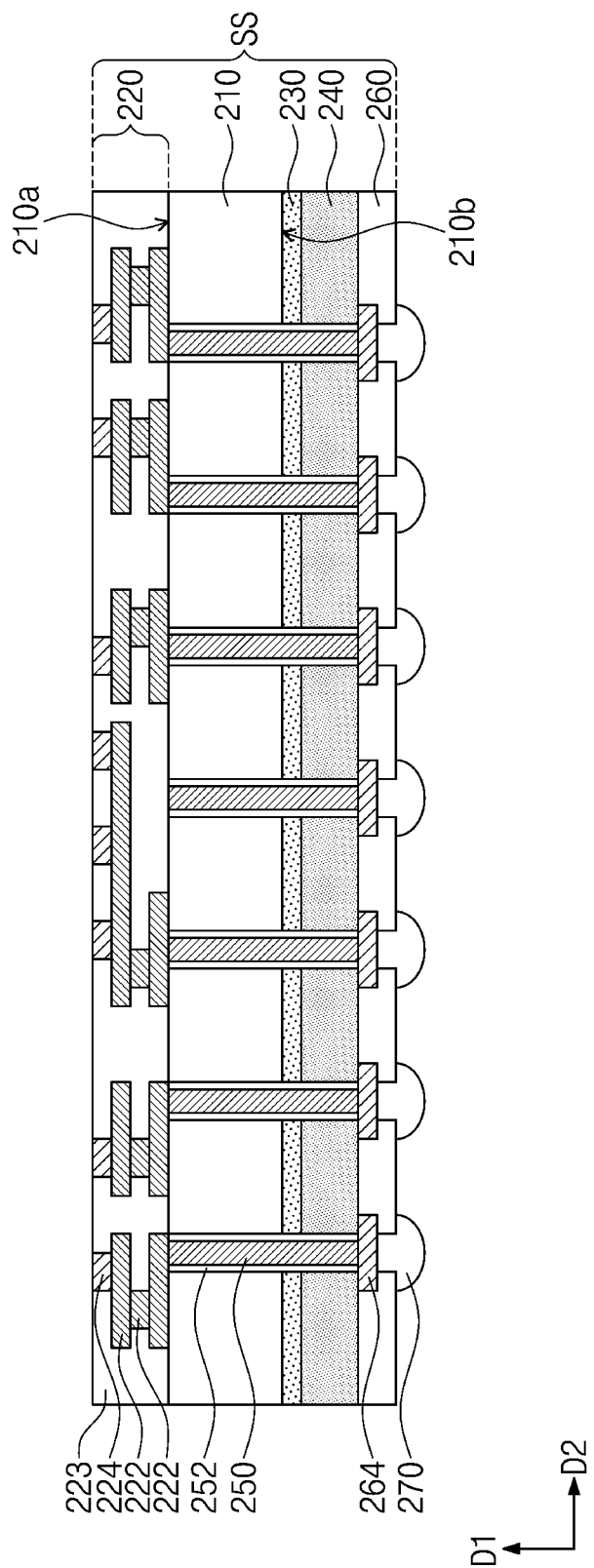

Referring to FIG. 7, according to some embodiments, second conductive pads 264 may be formed on the ground surface of the mold layer 240. Each of the second conductive pads 264 may cover the end of each of the plurality of through-electrodes 250. A buffer layer 260 may be formed on the ground surface of the mold layer 240 and may cover the second conductive pads 264. The buffer layer 260 may extend between the second conductive pads 264 so as to be in contact with the mold layer 240.

A plurality of bumps 270 may be formed on the buffer layer 260 on the second surface 210b of the upper substrate 210. For example, the formation of the plurality of bumps 270 may include removing a portion of the buffer layer 260 to form a recess exposing a portion of each of the second conductive pads 264. Each of the plurality of bumps 270 may be formed to fill the recess and may be connected to a corresponding second conductive pad 264.

The upper substrate 210, the interconnection layer 220, the insulating layer 230, the mold layer 240, the buffer layer 260, the plurality of through-electrodes 250, the plurality of insulating liners 252, the second conductive pads 264 and the plurality of bumps 270 may constitute a stack structure SS.

Figure 8:
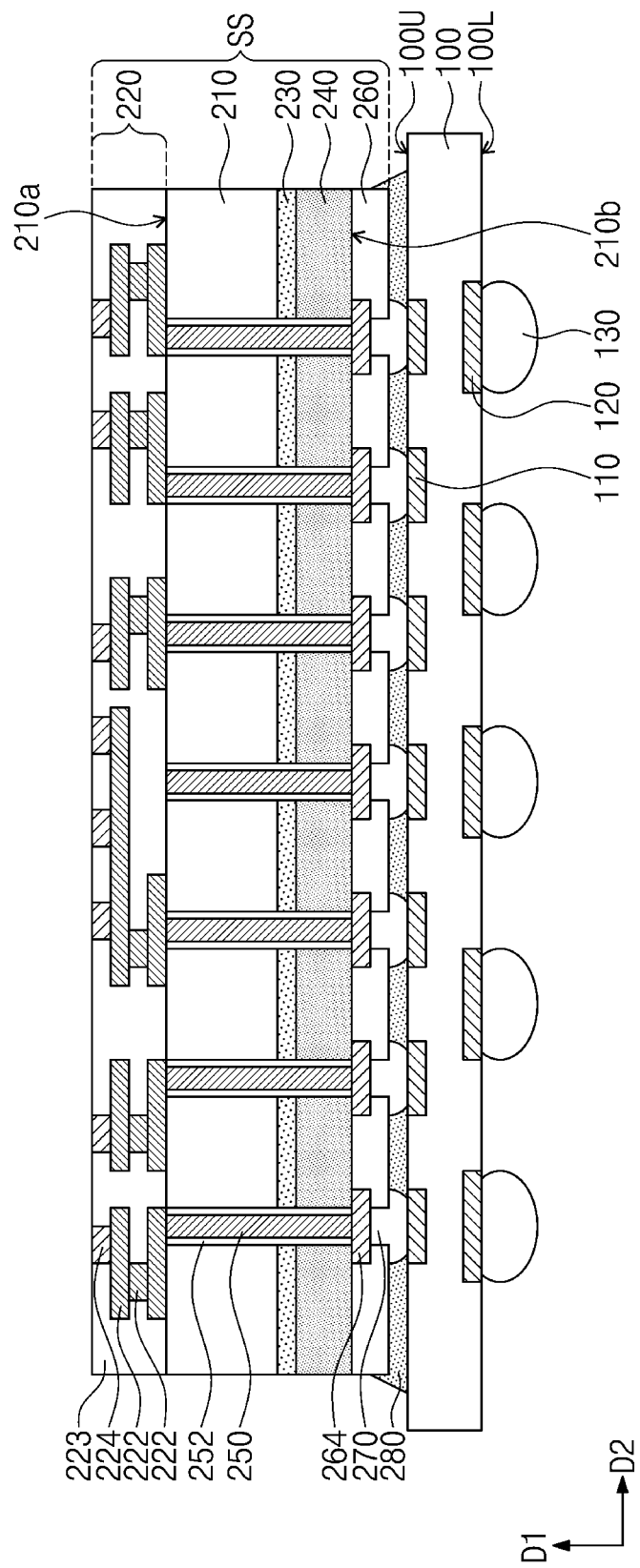

Referring to FIG. 8, the stack structure SS may be mounted on a lower substrate 100. The lower substrate 100 may include first lower substrate pads 110 adjacent to a top surface 100U of the lower substrate 100, and second lower substrate pads 120 adjacent to a bottom surface 100L of the lower substrate 100. The stack structure SS may be disposed on the lower substrate 100 in such a way that the second surface 210b of the upper substrate 210 faces the top surface 100U of the lower substrate 100. The plurality of bumps 270 may be connected to corresponding ones of the first lower substrate pads 110. In an exemplary embodiment, each bump 270 may be connected to a corresponding one of the first lower substrate pads 110.

A lower underfill layer 280 may be formed between the lower substrate 100 and the buffer layer 260. The lower underfill layer 280 may be formed to fill a space between the plurality of bumps 270. External terminals 130 may be disposed on the bottom surface 100L of the lower substrate 100 and may be connected to the second lower substrate pads 120, respectively.

Referring again to FIGS. 1 and 2, connection bumps 330 may be formed on the first conductive pads 224. Each of the connection bumps 330 may be formed on a corresponding one of the first conductive pads 224 and may be connected to the corresponding first conductive pad 224.

A plurality of semiconductor chips 300 may be disposed on the first surface 210a of the upper substrate 210 and may be mounted on the interconnection layer 220. Each of the plurality of semiconductor chips 300 may include chip pads 320, and the chip pads 320 may be disposed adjacent to the first surface 300S of each of the plurality of semiconductor chips 300. Each of the plurality of semiconductor chips 300 may be provided on the interconnection layer 220 in such a way that the chip pads 320 are in contact with corresponding ones of the connection bumps 330. In an exemplary embodiment, each chip pad 320 may be in contact with a corresponding one of the connection bumps 330. Each of the plurality of semiconductor chips 300 may include a circuit layer 310 adjacent to the first surface 300S of each of the plurality of semiconductor chips 300. The plurality of semiconductor chips 300 may be horizontally spaced apart from each other on the interconnection layer 220.

An upper underfill layer 340 may be formed between the interconnection layer 220 and the first surface 300S of each of the plurality of semiconductor chips 300. The upper underfill layer 340 may be formed to fill a space between the connection bumps 330.

Figure 9:
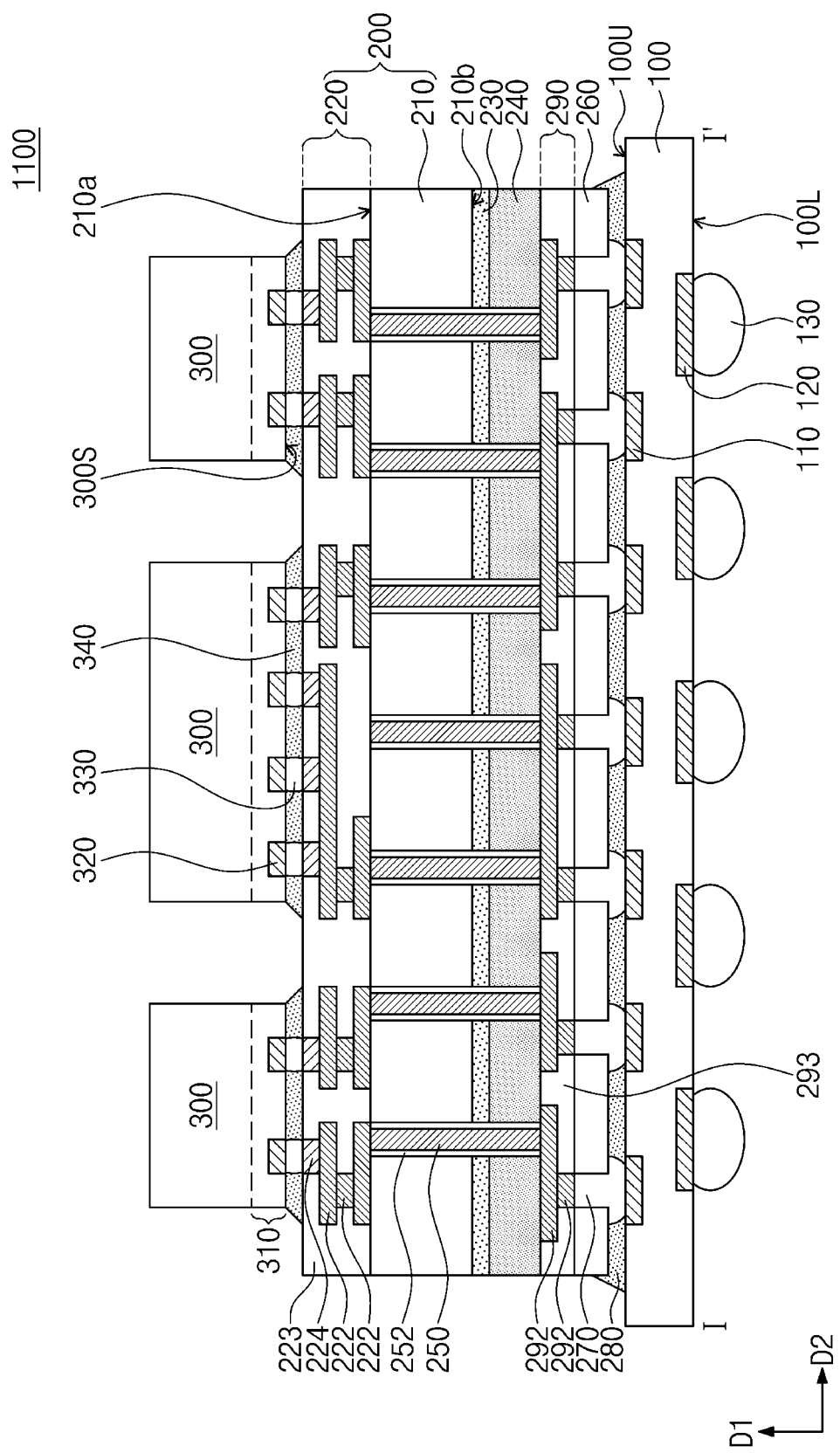
FIG. 9 is a cross-sectional view corresponding to the line I-I' of FIG. 1 to illustrate a semiconductor package according to some embodiments of the inventive concepts.

FIG. 9 is a cross-sectional view corresponding to the line I-I' of FIG. 1 to illustrate a semiconductor package 1100 according to some embodiments of the inventive concepts. Hereinafter, differences between the semiconductor package 1100 and the semiconductor package 1000 described with reference to FIGS. 1 and 2 will be mainly described for the purpose of ease and convenience in explanation.

Referring to FIG. 9, according to some embodiments, a redistribution layer 290 may be disposed between the mold layer 240 and the buffer layer 260. The redistribution layer 290 may include redistribution patterns 292 and a redistribution insulating layer 293 covering the redistribution patterns 292. The redistribution insulating layer 293 may extend between the redistribution patterns 292 so as to be in contact with the mold layer 240. The redistribution patterns 292 may include a conductive material, and the redistribution insulating layer 293 may include an insulating material. Each of the plurality of through-electrodes 250 may penetrate the mold layer 240 so as to be connected to a corresponding one of the redistribution patterns 292. The buffer layer 260 may be spaced apart from the mold layer 240 with the redistribution layer 290 interposed therebetween.

The plurality of bumps 270 may be disposed between the lower substrate 100 and the buffer layer 260. The plurality of bumps 270 may be disposed on the buffer layer 260 and may be spaced apart from the mold layer 240. In some embodiments, each of the plurality of bumps 270 may extend into the buffer layer 260 and may be connected to a corresponding one of the redistribution patterns 292. Each of the plurality of bumps 270 may be electrically connected to a corresponding one of the plurality of through-electrodes 250 through the corresponding redistribution pattern 292.

Figure 10:
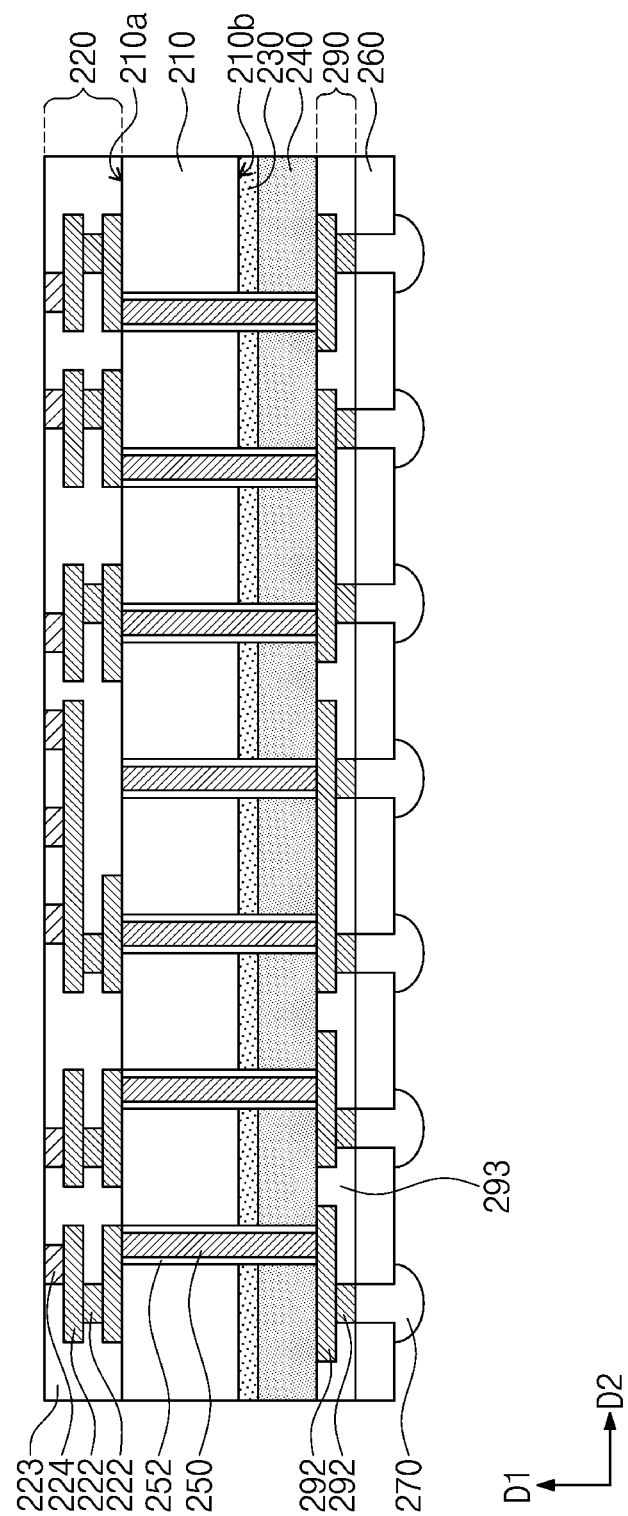
FIG. 10 is a cross-sectional view corresponding to the line I-I' of FIG. 1 to illustrate a method of manufacturing a semiconductor package, according to some embodiments of the inventive concepts.

FIG. 10 is a cross-sectional view corresponding to the line I-I' of FIG. 1 to illustrate a method of manufacturing a semiconductor package, according to some embodiments of the inventive concepts. Hereinafter, differences between the present embodiments and the above embodiments described with reference to FIGS. 1 to 8 will be mainly described for the purpose of ease and convenience in explanation.

As described with reference to FIG. 6, the grinding process may be performed on the preliminary mold layer 240-P as shown in FIG. 5, and thus a portion of the preliminary mold layer 240-P, a portion of each of the plurality of through-electrodes 250 and a portion of each of the plurality of insulating liners 252 may be removed. Therefore, an end of each of the plurality of through-electrodes 250 and an end of each of the plurality of insulating liners 252 may be exposed.

Referring to FIG. 10, a redistribution layer 290 may be formed on the ground surface of the mold layer 240. The formation of the redistribution layer 290 may include forming redistribution patterns 292 on the ground surface of the mold layer 240, and forming a redistribution insulating layer 293 covering the redistribution patterns 292 on the ground surface of the mold layer 240. The redistribution patterns 292 may be formed to be connected to the plurality of through-electrodes 250, respectively. The redistribution insulating layer 293 may extend between the redistribution patterns 292 so as to be in contact with the mold layer 240.

A buffer layer 260 may be formed on the redistribution layer 290 on the second surface 210b of the upper substrate 210. A plurality of bumps 270 may be formed on the buffer layer 260 on the second surface 210b of the upper substrate 210. For example, the formation of the plurality of bumps 270 may include removing a portion of the buffer layer 260 to form a recess exposing a corresponding one of the redistribution patterns 292. Each of the plurality of bumps 270 may be formed to fill the recess and may be connected to the corresponding redistribution pattern 292.

Except for the differences as described above, the method of manufacturing the semiconductor package according to the present embodiments may be substantially the same as the method of manufacturing the semiconductor package described with reference to FIGS. 1 to 8.

Figure 11:
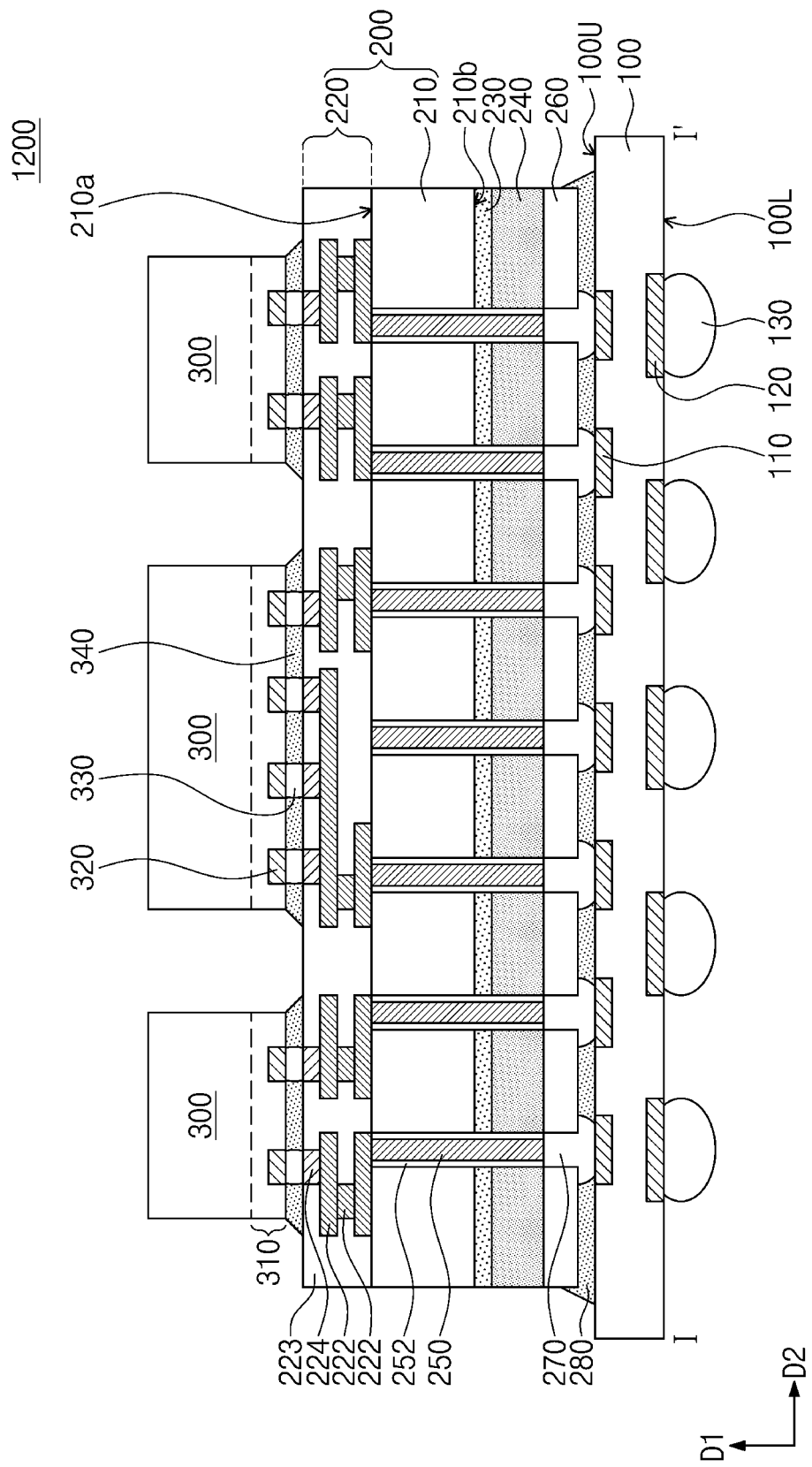
FIG. 11 is a cross-sectional view corresponding to the line I-I' of FIG. 1 to illustrate a semiconductor package according to some embodiments of the inventive concepts.

FIG. 11 is a cross-sectional view corresponding to the line I-I' of FIG. 1 to illustrate a semiconductor package 1200 according to some embodiments of the inventive concepts. Hereinafter, differences between the semiconductor package 1200 and the semiconductor package 1000 described with reference to FIGS. 1 and 2 will be mainly described for the purpose of ease and convenience in explanation.

Referring to FIG. 11, according to some embodiments, the second conductive pads 264 may be omitted. The plurality of bumps 270 may be disposed on the buffer layer 260, and each of the plurality of bumps 270 may penetrate the buffer layer 260 so as to be connected directly to a corresponding one of the plurality of through-electrodes 250. Each of the plurality of bumps 270 may be in contact with the corresponding through-electrode 250. The buffer layer 260 may be in contact with the mold layer 240 between the plurality of bumps 270.

Figure 12:
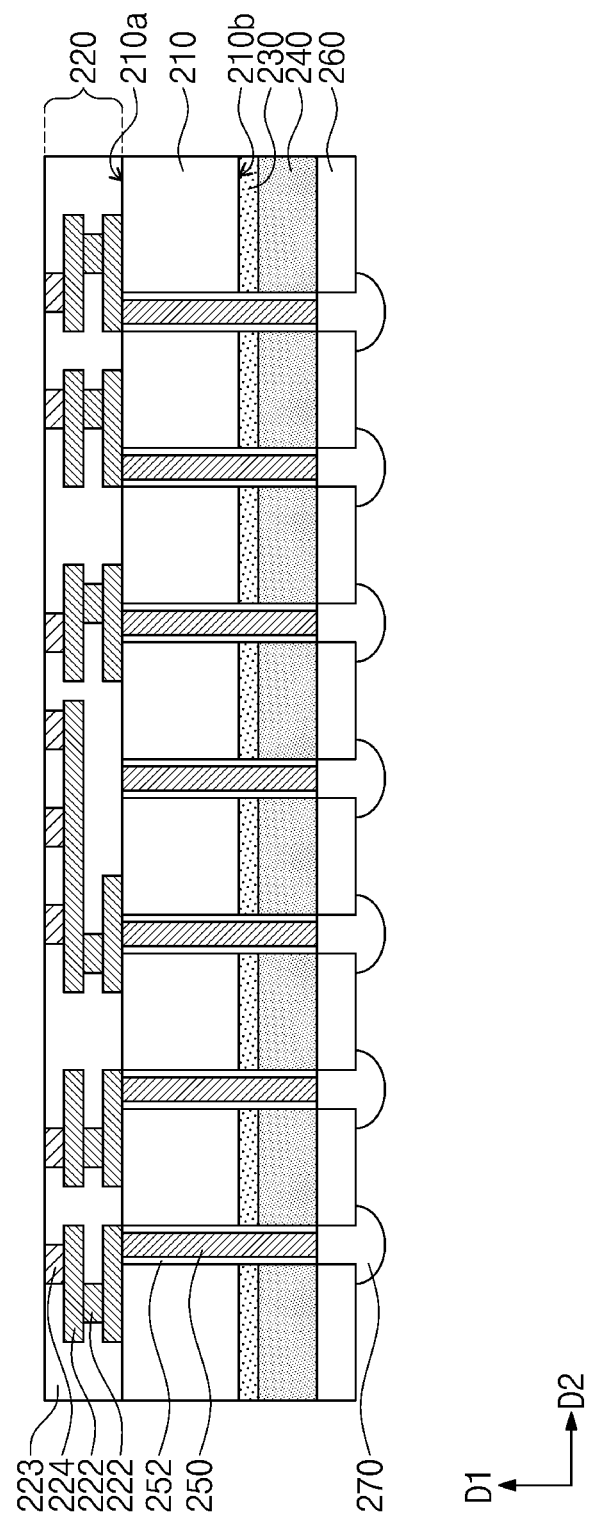
FIG. 12 is a cross-sectional view corresponding to the line I-I' of FIG. 1 to illustrate a method of manufacturing a semiconductor package, according to some embodiments of the inventive concepts.

FIG. 12 is a cross-sectional view corresponding to the line I-I' of FIG. 1 to illustrate a method of manufacturing a semiconductor package, according to some embodiments of the inventive concepts. Hereinafter, differences between the present embodiments and the above embodiments described with reference to FIGS. 1 to 8 will be mainly described for the purpose of ease and convenience in explanation.

As described with reference to FIG. 6, the grinding process may be performed on the preliminary mold layer 240-P as shown in FIG. 5, and thus a portion of the preliminary mold layer 240-P, a portion of each of the plurality of through-electrodes 250 and a portion of each of the plurality of insulating liners 252 may be removed. Therefore, an end of each of the plurality of through-electrodes 250 and an end of each of the plurality of insulating liners 252 may be exposed.

Referring to FIG. 12, a buffer layer 260 may be formed on the ground surface of the mold layer 240. The buffer layer 260 may cover the end of each of the plurality of through-electrodes 250 and the end of each of the plurality of insulating liners 252. A plurality of bumps 270 may be formed on the buffer layer 260. For example, the formation of the plurality of bumps 270 may include removing a portion of the buffer layer 260 to form a recess exposing the end of each of the plurality of through-electrodes 250. Each of the plurality of bumps 270 may be formed to fill the recess and may be connected directly to a corresponding through-electrode 250.

Except for the differences as described above, the method of manufacturing the semiconductor package according to the present embodiments may be substantially the same as the method of manufacturing the semiconductor package described with reference to FIGS. 1 to 8.

Figure 13:
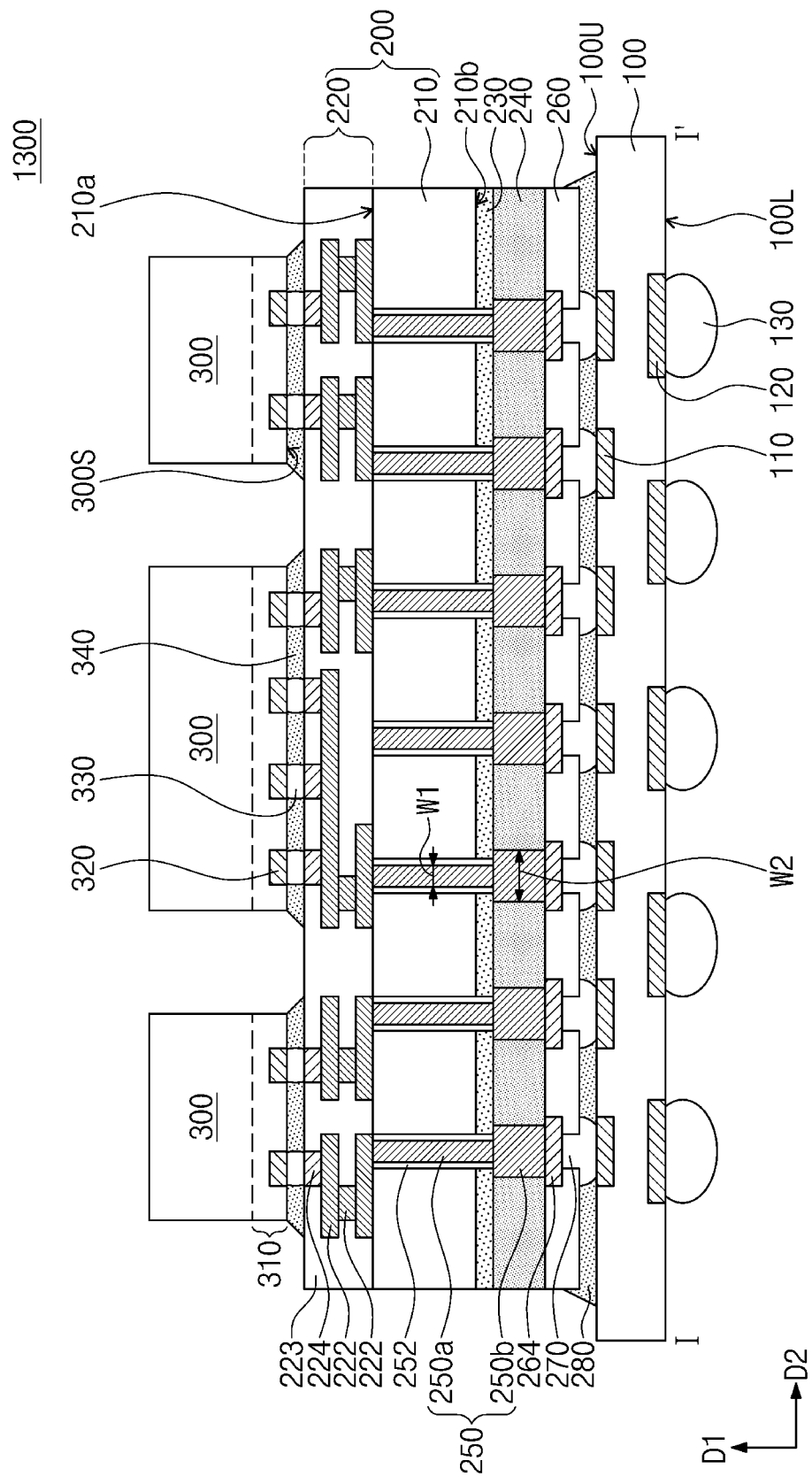
FIG. 13 is a cross-sectional view corresponding to the line I-I' of FIG. 1 to illustrate a semiconductor package according to some embodiments of the inventive concepts.

FIG. 13 is a cross-sectional view corresponding to the line I-I' of FIG. 1 to illustrate a semiconductor package 1300 according to some embodiments of the inventive concepts. Hereinafter, differences between the semiconductor package 1300 and the semiconductor package 1000 described with reference to FIGS. 1 and 2 will be mainly described for the purpose of ease and convenience in explanation.

Referring to FIG. 13, each of the plurality of through-electrodes 250 may include a first through-electrode 250a penetrating the upper substrate 210, and a second through-electrode 250b penetrating the mold layer 240. The first through-electrode 250a may be connected to a lowermost metal interconnection line 222 of the metal interconnection lines 222 and may be connected to the second through-electrode 250b. In some embodiments, the first through-electrode 250a may penetrate the insulating layer 230 so as to be connected directly to the second through-electrode 250b. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The insulating liner 252 may be disposed between the first through-electrode 250a and the upper substrate 210. In some embodiments, the insulating liner 252 may extend between the first through-electrode 250a and the insulating layer 230. The first through-electrode 250a may include a conductive material (e.g., copper (Cu)). For example, the second through-electrode 250b may include the same conductive material as the first through-electrode 250a. Alternatively, the second through-electrode 250b may include a different conductive material from that of the first through-electrode 250a.

Each of the first and second through-electrodes 250a and 250b may have a width in the second direction D2 parallel to the first surface 210a of the upper substrate 210. A first width W1 of the first through-electrode 250a may be less than a second width W2 of the second through-electrode 250b (i.e., W1<W2). The first through-electrode 250a and the second through-electrode 250b may overlap with each other in the first direction D1 perpendicular to the first surface 210a of the upper substrate 210. The second through-electrode 250b may be in contact with the first through-electrode 250a and may be in contact with a bottommost surface of the insulating liner 252. The mold layer 240 may be in contact with a sidewall of the second through-electrode 250b.

The second through-electrode 250b may penetrate the mold layer 240 so as to be connected to a corresponding one of the second conductive pads 264. The second through-electrode 250b may be electrically connected to a corresponding one of the plurality of bumps 270 through the corresponding second conductive pad 264.

Figure 14:
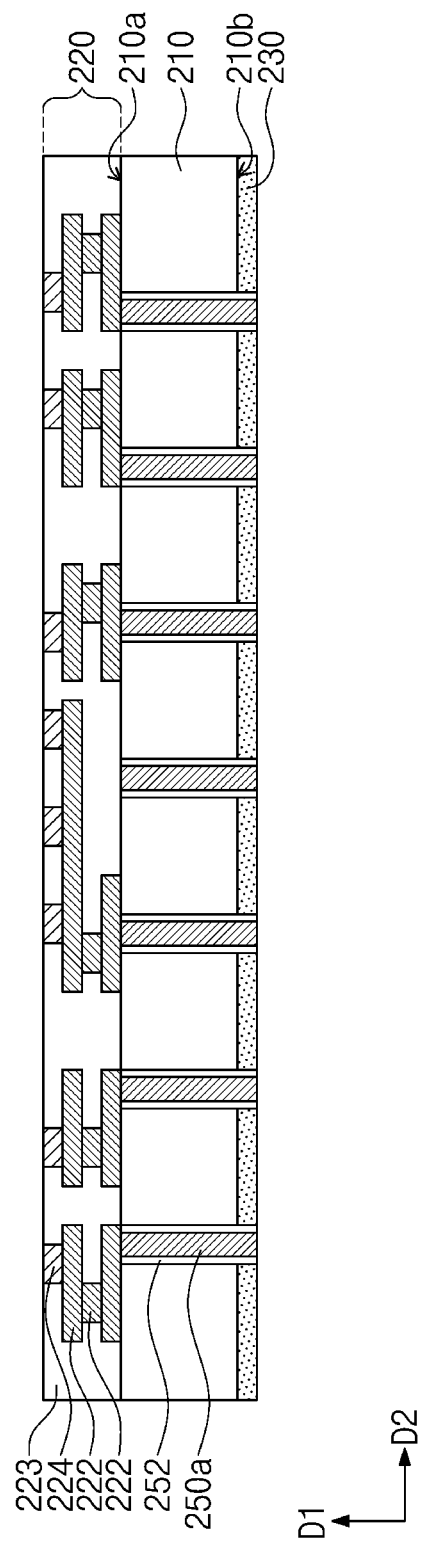
FIGS. 14 to 16 are cross-sectional views corresponding to the line I-I' of FIG. 1 to illustrate a method of manufacturing a semiconductor package, according to some embodiments of the inventive concepts.
Figure 15:
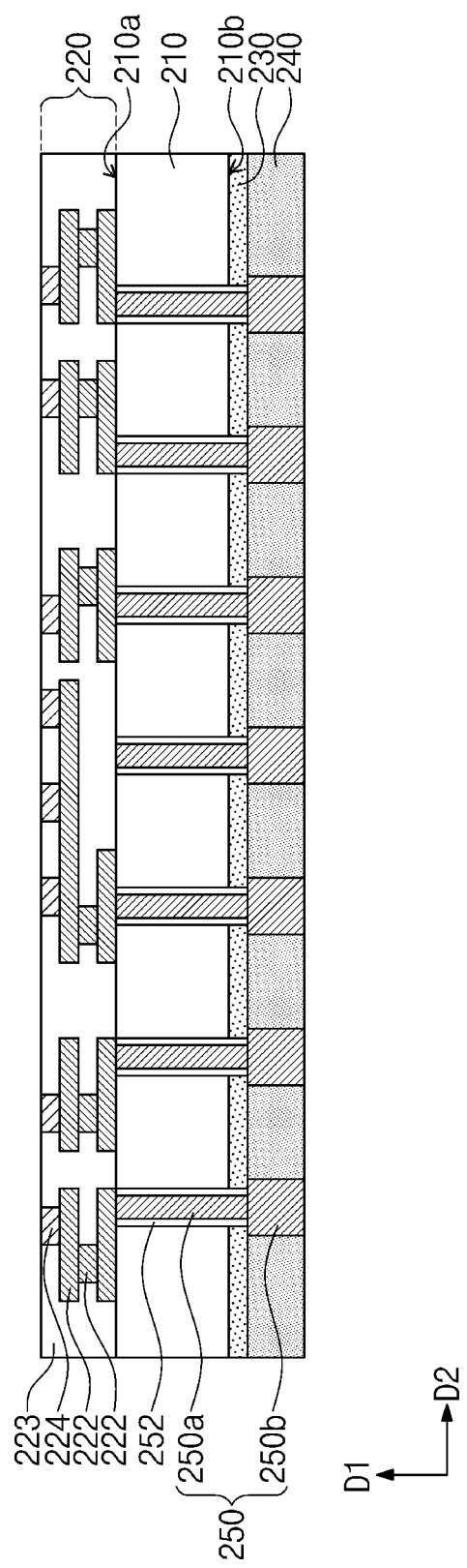
Figure 16:
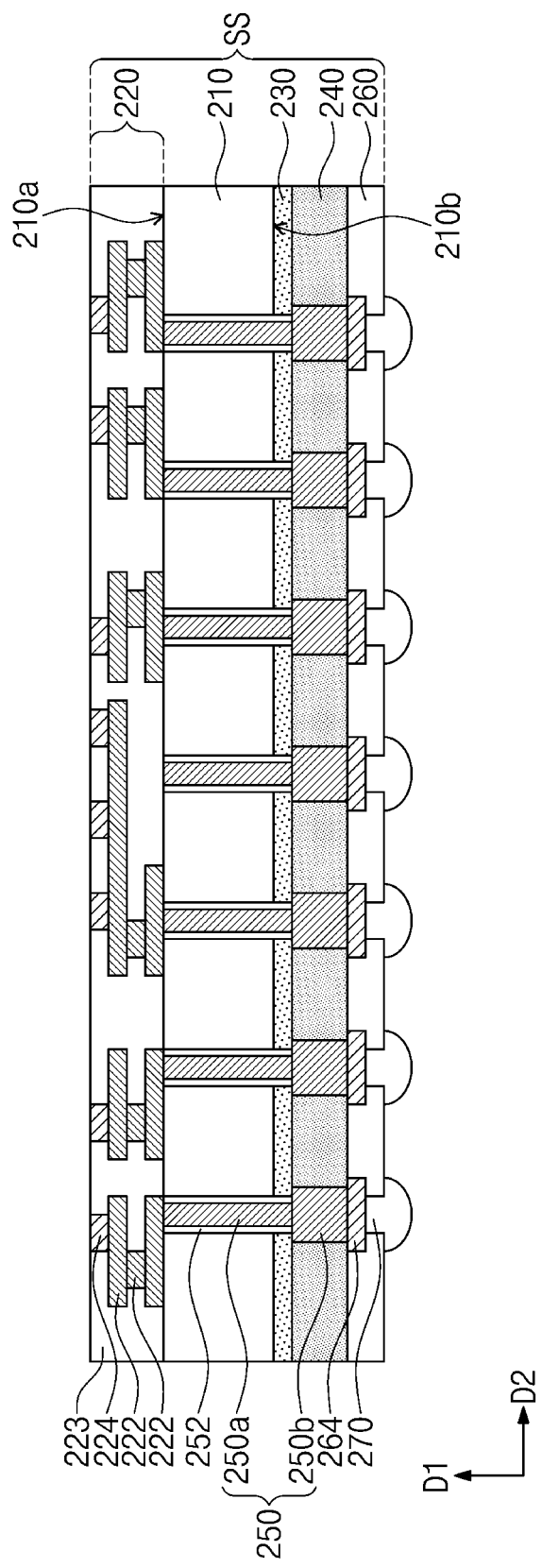

FIGS. 14 to 16 are cross-sectional views corresponding to the line I-I' of FIG. 1 to illustrate a method of manufacturing a semiconductor package, according to some embodiments of the inventive concepts. Hereinafter, differences between the present embodiments and the above embodiments described with reference to FIGS. 1 to 8 will be mainly described for the purpose of ease and convenience in explanation.

Referring to FIG. 14, a plurality of first through-electrodes 250a and a plurality of insulating liners 252 may be formed in an upper substrate 210. An interconnection layer 220 may be formed on a first surface 210a of the upper substrate 210, and an insulating layer 230 may be formed on a second surface 210b of the upper substrate 210. The plurality of first through-electrodes 250a, the plurality of insulating liners 252, the interconnection layer 220 and the insulating layer 230 may be formed by substantially the same method as of forming the plurality of through-electrodes 250, the plurality of insulating liners 252, the interconnection layer 220 and the insulating layer 230, described with reference to FIGS. 3 and 4.

A grinding process may be performed on the insulating layer 230, and a portion of the insulating layer 230, a portion of each of the plurality of first through-electrodes 250a and a portion of each of the plurality of insulating liners 252 may be removed by the grinding process. Thus, an end of each of the plurality of first through-electrodes 250a and an end of each of the plurality of insulating liners 252 may be exposed.

Referring to FIG. 15, a plurality of second through-electrodes 250b may be formed on a ground surface of the insulating layer 230. For example, the formation of the plurality of second through-electrodes 250*b* may include depositing a conductive layer on the insulating layer 230, and patterning the conductive layer. A mold layer 240 may be formed on the ground surface of the insulating layer 230 and may cover the plurality of second through-electrodes 250*b*. In some embodiments, an additional grinding process may be performed on the mold layer 240, and ends of the plurality of second through-electrodes 250*b* may be exposed by the additional grinding process.

Referring to FIG. 16, second conductive pads 264 may be formed on the mold layer 240, and each of the second conductive pads 264 may cover the end of a corresponding one of the plurality of second through-electrodes 250*b*. In an exemplary embodiment, each of the second conductive pads 264 may be in contact with the end of a corresponding one of the plurality of second through-electrodes 250*b*. A buffer layer 260 may be formed on the mold layer 240 and may cover the second conductive pads 264. A plurality of bumps 270 may be formed on the buffer layer 260. Each of the plurality of bumps 270 may extend into the buffer layer 260 so as to be connected to a corresponding one of the second conductive pads 264.

Except for the differences as described above, the method of manufacturing the semiconductor package according to the present embodiments may be substantially the same as the method of manufacturing the semiconductor package described with reference to FIGS. 1 to 8.

Figure 17:
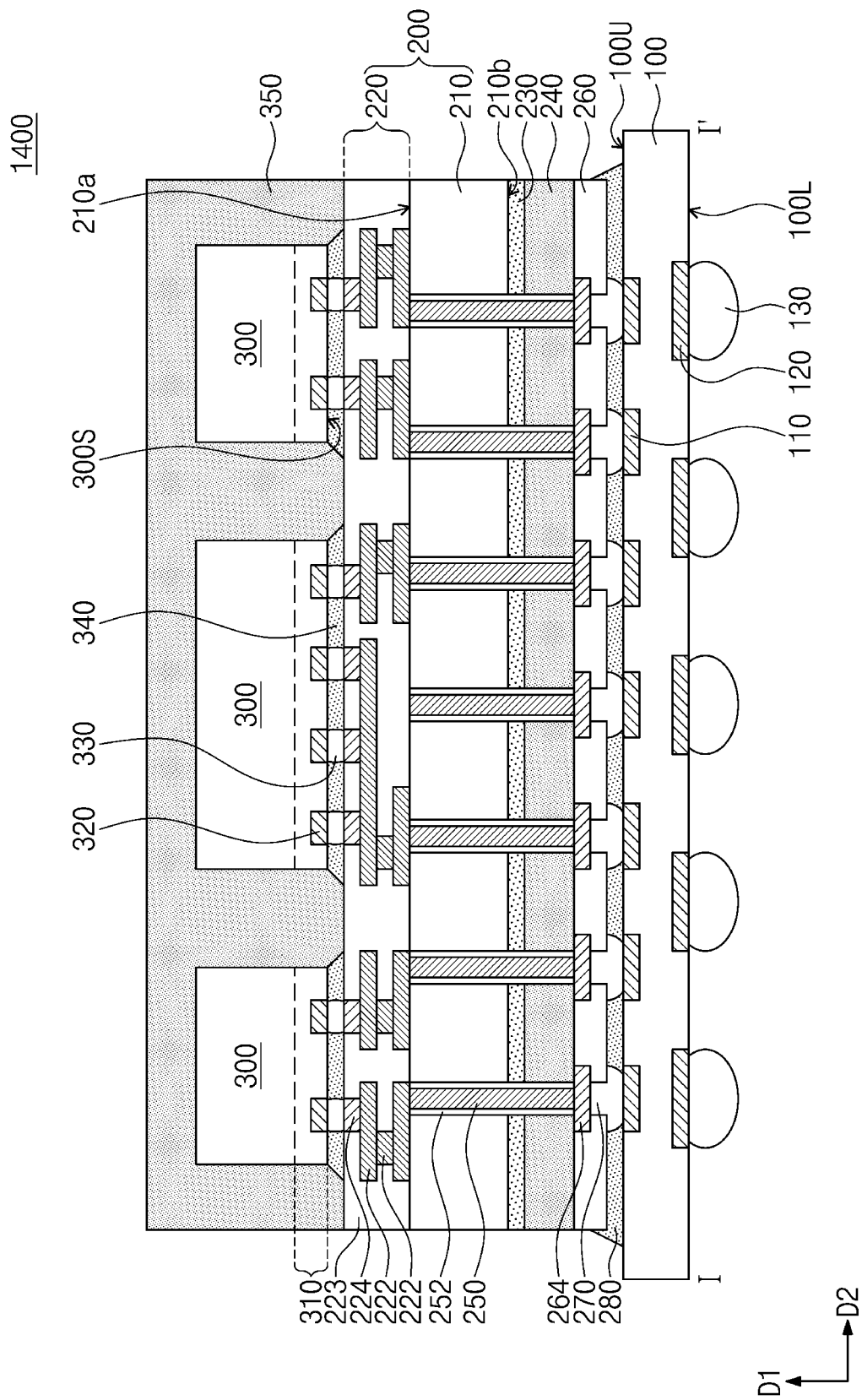
FIG. 17 is a cross-sectional view corresponding to the line I-I' of FIG. 1 to illustrate a semiconductor package according to some embodiments of the inventive concepts.

FIG. 17 is a cross-sectional view corresponding to the line I-I' of FIG. 1 to illustrate a semiconductor package 1400 according to some embodiments of the inventive concepts. Hereinafter, differences between the semiconductor package 1400 and the semiconductor package 1000 described with reference to FIGS. 1 and 2 will be mainly described for the purpose of ease and convenience in explanation.

Referring to FIG. 17, the semiconductor package 1400 may further include an upper mold layer 350 disposed on the first surface 210*a* of the upper substrate 210. The upper mold layer 350 may be disposed on the interconnection layer 220 and may cover the plurality of semiconductor chips 300. In some embodiments, the upper mold layer 350 may include the same material as the mold layer 240. In certain embodiments, the upper mold layer 350 may include a different material from that of the mold layer 240. The upper mold layer 350 may include an insulating material (e.g., an epoxy molding compound).

Figure 18:
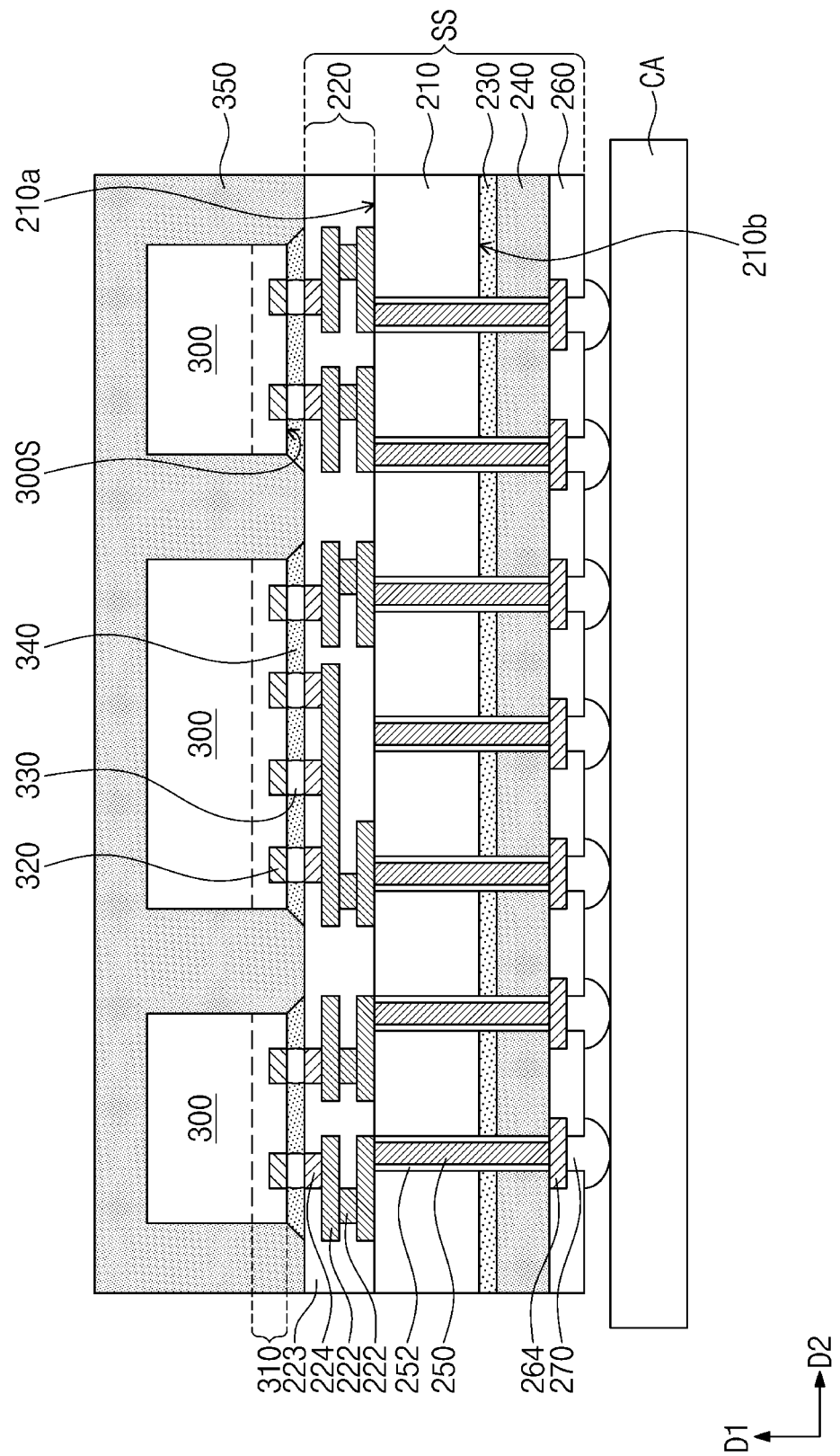
FIG. 18 is a cross-sectional view corresponding to the line I-I' of FIG. 1 to illustrate a method of manufacturing a semiconductor package, according to some embodiments of the inventive concepts.

FIG. 18 is a cross-sectional view corresponding to the line I-I' of FIG. 1 to illustrate a method of manufacturing a semiconductor package, according to some embodiments of the inventive concepts. Hereinafter, differences between the present embodiments and the above embodiments described with reference to FIGS. 1 to 8 will be mainly described for the purpose of ease and convenience in explanation.

The upper substrate 210, the interconnection layer 220, the insulating layer 230, the mold layer 240, the buffer layer 260, the plurality of through-electrodes 250, the plurality of insulating liners 252, the second conductive pads 264 and the plurality of bumps 270 may be formed as described with reference to FIGS. 3 to 7. The upper substrate 210, the interconnection layer 220, the insulating layer 230, the mold layer 240, the buffer layer 260, the plurality of through-electrodes 250, the plurality of insulating liners 252, the second conductive pads 264 and the plurality of bumps 270 may constitute a stack structure SS.

Referring to FIG. 18, the stack structure SS may be provided on a carrier substrate CA. The stack structure SS may be provided on the carrier substrate CA in such a way that the second surface 210*b* of the upper substrate 210 faces the carrier substrate CA.

Connection bumps 330 may be formed on the first conductive pads 224, and each of the connection bumps 330 may be connected to a corresponding one of the first conductive pads 224.

A plurality of semiconductor chips 300 may be disposed on the first surface 210*a* of the upper substrate 210 and may be mounted on the interconnection layer 220. Each of the plurality of semiconductor chips 300 may include chip pads 320 disposed adjacent to the first surface 300S of each of the plurality of semiconductor chips 300. Each of the plurality of semiconductor chips 300 may be provided on the interconnection layer 220 in such a way that the chip pads 320 are in contact with corresponding ones of the connection bumps 330. In an exemplary embodiment, each chip pad 320 may be in contact with a corresponding one of the connection bumps 330. The plurality of semiconductor chips 300 may be horizontally spaced apart from each other on the interconnection layer 220.

An upper underfill layer 340 may be formed between the interconnection layer 220 and the first surface 300S of each of the plurality of semiconductor chips 300 and may fill a space between the connection bumps 330. An upper mold layer 350 may be formed on the interconnection layer 220 to cover the plurality of semiconductor chips 300.

Referring again to FIG. 17, the carrier substrate CA may be removed from the stack structure SS. Thereafter, the stack structure SS on which the plurality of semiconductor chips 300 is mounted may be mounted on a lower substrate 100.

Except for the differences as described above, the method of manufacturing the semiconductor package according to the present embodiments may be substantially the same as the method of manufacturing the semiconductor package described with reference to FIGS. 1 to 8.

Figure 19:
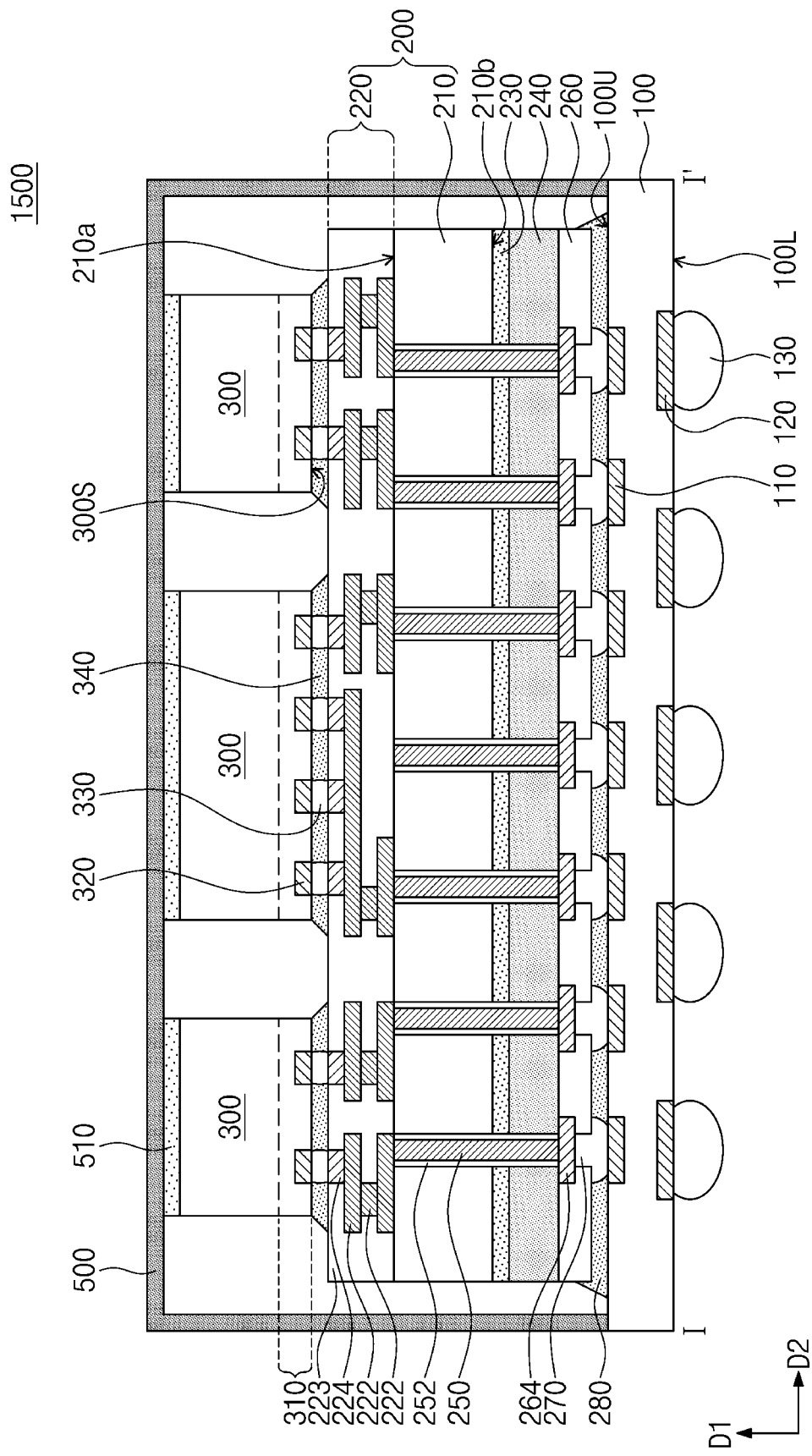
FIG. 19 is a cross-sectional view corresponding to the line I-I' of FIG. 1 to illustrate a semiconductor package according to some embodiments of the inventive concepts.

FIG. 19 is a cross-sectional view corresponding to the line I-I' of FIG. 1 to illustrate a semiconductor package 1500 according to some embodiments of the inventive concepts. Hereinafter, differences between the semiconductor package 1500 and the semiconductor package 1000 described with reference to FIGS. 1 and 2 will be mainly described for the purpose of ease and convenience in explanation.

Referring to FIG. 19, the semiconductor package 1500 may further include a heat dissipation structure 500 disposed on the lower substrate 100. The heat dissipation structure 500 may be disposed on the top surface 100U of the lower substrate 100, and the components of the semiconductor package 1000 described with reference to FIGS. 1 and 2 may be disposed inside the heat dissipation structure 500. In an exemplary embodiment, a space may be formed between the heat dissipation structure and the top surface 100U of the lower substrate 100, and the components of the semiconductor package 1000 described with reference to FIGS. 1 and 2 may be disposed in the space. The heat dissipation structure 500 may include a heat-conductive material. The heat-conductive material may include metal (e.g., copper and/or aluminum) or a carbon-containing material (e.g., graphene, graphite, and/or carbon nanotube). For example, the heat dissipation structure 500 may include a single metal layer or a plurality of stacked metal layers. The present invention is not limited thereto. In an exemplary embodiment, the heat dissipation structure 500 may include a heat sink or a heat pipe. For still other examples, the heat dissipation structure 500 may use a water cooling method.

The semiconductor package 1500 may further include a heat-conductive layer 510 disposed between the heat dissipation structure 500 and each of the plurality of semiconductor chips 300. The heat-conductive layer 510 may include a thermal interface material (TIM). The thermal interface material (TIM) may include, for example, a polymer and heat-conductive particles. The heat-conductive particles may be dispersed in the polymer. Heat generated from the plurality of semiconductor chips 300 may be transferred to the heat dissipation structure 500 through the heat-conductive layer 510.

Figure 20:
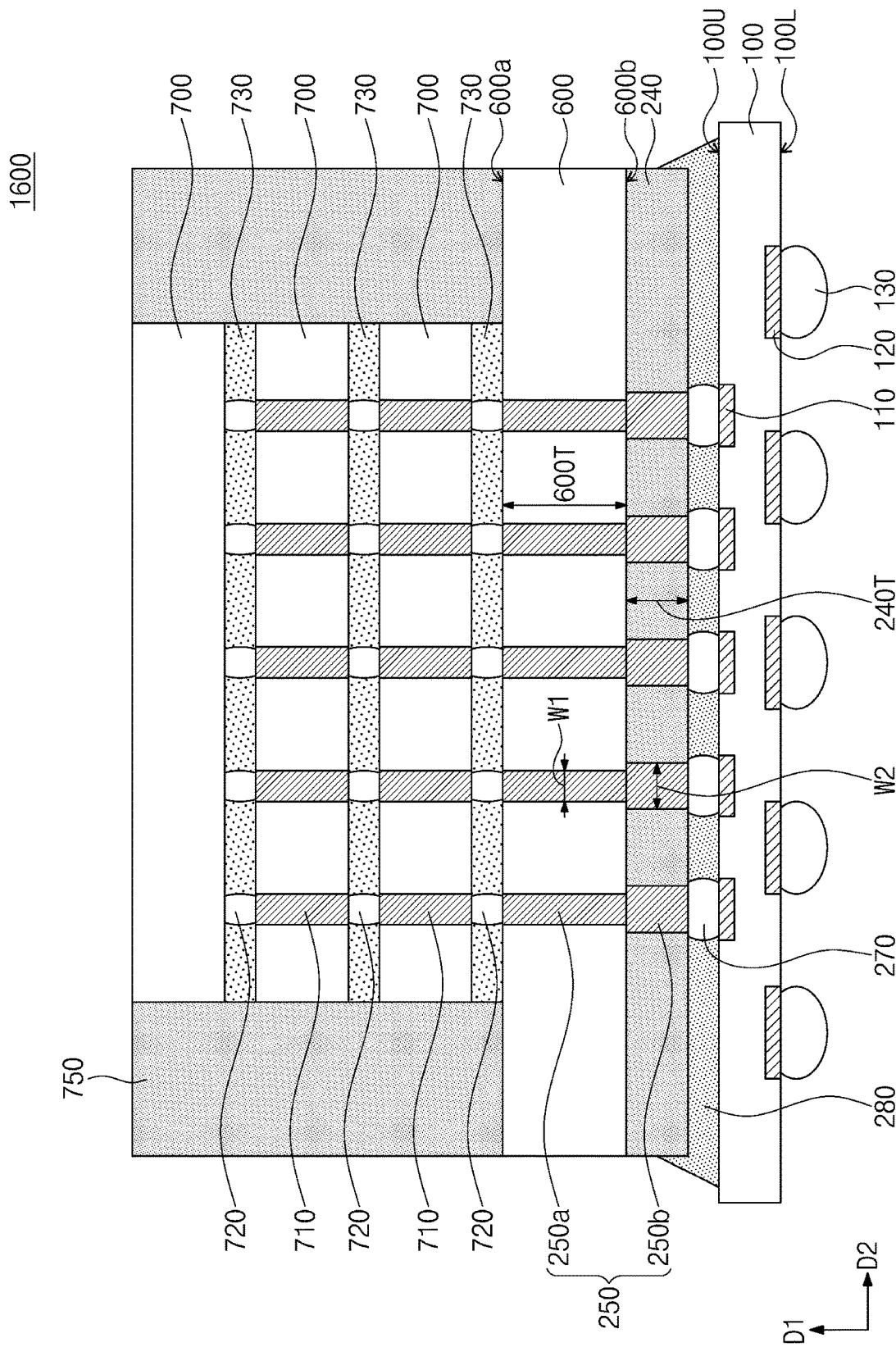
FIG. 20 is a cross-sectional view illustrating a semiconductor package according to some embodiments of the inventive concepts.

FIG. 20 is a cross-sectional view illustrating a semiconductor package 1600 according to some embodiments of the inventive concepts.

Referring to FIG. 20, the semiconductor package 1600 may include a lower substrate 100, a lower semiconductor chip 600 on the lower substrate 100, a mold layer 240 between the lower substrate 100 and the lower semiconductor chip 600, and a plurality of upper semiconductor chips 700 mounted on the lower semiconductor chip 600. The plurality of upper semiconductor chips 700 may be vertically stacked on each other.

The lower semiconductor chip 600 may have a first surface 600a and a second surface 600b which are opposite to each other. The lower semiconductor chip 600 may be disposed on the lower substrate 100 in such a way that the second surface 600b faces a top surface 100U of the lower substrate 100. The mold layer 240 may be disposed between the second surface 600b of the lower semiconductor chip 600 and the lower substrate 100. The plurality of upper semiconductor chips 700 may be mounted on the first surface 600a of the lower semiconductor chip 600. The plurality of upper semiconductor chips 700 may be stacked in a first direction D1 perpendicular to the first surface 600a of the lower semiconductor chip 600. The lower semiconductor chip 600 may include a circuit layer (not shown) adjacent to the first surface 600a or the second surface 600b. For example, the lower semiconductor chip 600 may be a logic chip, and the plurality of upper semiconductor chips 700 may be the same kind of a semiconductor device such as memory chips. In the present specification, the lower semiconductor chip 600 may serve as an upper substrate of FIGS. 1 and 2.

A plurality of through-electrodes 250 may be disposed in the lower semiconductor chip 600. Each of the plurality of through-electrodes 250 may penetrate the lower semiconductor chip 600 and may extend into the mold layer 240 to penetrate the mold layer 240. Each of the plurality of through-electrodes 250 may include a first through-electrode 250a penetrating the lower semiconductor chip 600, and a second through-electrode 250b penetrating the mold layer 240. In some embodiments, the first through-electrode 250a may be connected directly to the second through-electrode 250b. The first through-electrode 250a may include a conductive material (e.g., copper (Cu)). For example, the second through-electrode 250b may include the same conductive material as the first through-electrode 250a. Alternatively, the second through-electrode 250b may include a different conductive material from that of the first through-electrode 250a.

Each of the first and second through-electrodes 250a and 250b may have a width in a second direction D2 parallel to the first surface 600a of the lower semiconductor chip 600. A first width W1 of the first through-electrode 250a may be less than a second width W2 of the second through-electrode 250b (i.e., W1<W2). The first through-electrode 250a and the second through-electrode 250b may overlap with each other in the first direction D1 perpendicular to the first surface 600a of the lower semiconductor chip 600. The second through-electrode 250b may be in contact with the first through-electrode 250a, and the mold layer 240 may be in contact with a sidewall of the second through-electrode 250b.

The mold layer 240 may include an insulating material of which a coefficient of thermal expansion is greater than that of the lower semiconductor chip 600. The mold layer 240 may include fillers (e.g., silica). For example, the mold layer 240 may include an epoxy molding compound (EMC) including the fillers (e.g., silica).

Each of the lower semiconductor chip 600 and the mold layer 240 may have a thickness in the first direction D1. A thickness 240T of the mold layer 240 may be less than a thickness 600T of the lower semiconductor chip 600. For example, the thickness 240T of the mold layer 240 may have a value in a range from about 5 μm to about 100 μm.

A plurality of bumps 270 may be disposed between the lower substrate 100 and the mold layer 240. Each of the plurality of through-electrodes 250 may penetrate the mold layer 240 so as to be connected to a corresponding one of the plurality of bumps 270. For example, each of the second through-electrodes 250b may penetrate the mold layer 240 so as to be connected to a corresponding one of the plurality of bumps 270. Each of the plurality of bumps 270 may include a conductive material and may have at least one of a solder ball shape, a bump shape, or a pillar shape.

The lower substrate 100 may include first lower substrate pads 110 adjacent to the top surface 100U of the lower substrate 100, and second lower substrate pads 120 adjacent to a bottom surface 100L of the lower substrate 100. External terminals 130 may be disposed on the bottom surface 100L of the lower substrate 100 and may be connected to the second lower substrate pads 120, respectively. The plurality of bumps 270 may be connected to the first lower substrate pads 110, respectively. The lower semiconductor chip 600 may be electrically connected to the lower substrate 100 through the plurality of through-electrodes 250 and the plurality of bumps 270. The lower substrate 100 may be substantially the same as the lower substrate 100 described with reference to FIGS. 1 and 2.

A lower underfill layer 280 may be disposed between the lower substrate 100 and the mold layer 240 and may fill a space between the plurality of bumps 270. The lower underfill layer 280 may include an insulating polymer material such as an epoxy resin.

The plurality of upper semiconductor chips 700 may be electrically connected to each other through through-vias 710 and upper bumps 720. In an exemplary embodiment, no through-vias are disposed in the uppermost upper semiconductor chip 700, and the through-vias 710 may be disposed in each of the remaining upper semiconductor chips 700. The upper bumps 720 may be disposed between the plurality of upper semiconductor chips 700 and between the lower semiconductor chip 600 and the lowermost one of the plurality of upper semiconductor chips 700. The upper bumps 720 may be connected to the through-vias 710.

The plurality of through-electrodes 250 may be connected to corresponding ones of the upper bumps 720 disposed between the lowermost upper semiconductor chip 700 and the lower semiconductor chip 600. For example, each of the first through-electrodes 250a may be connected to a corresponding one of the upper bumps 720. Thus, the lowermost upper semiconductor chip 700 may be electrically connected to the lower semiconductor chip 600. The plurality of upper semiconductor chips 700 may be electrically connected to the lower substrate 100 through the through-vias 710, the upper bumps 720, the plurality of through-electrodes 250 and the plurality of bumps 270.

Additional underfill layers 730 may be disposed between the plurality of upper semiconductor chips 700, and between the lower semiconductor chip 600 and the lowermost one of the plurality of upper semiconductor chips 700. The additional underfill layer 730 may fill a space between the upper bumps 720. The additional underfill layer 730 may include an insulating polymer material such as an epoxy resin.

An additional mold layer 750 may be disposed on the first surface 600a of the lower semiconductor chip 600 and may cover sidewalls of the plurality of upper semiconductor chips 700. In some embodiments, the additional mold layer 750 may include the same material as the mold layer 240. In certain embodiments, the additional mold layer 750 may include a different material from that of the mold layer 240. The additional mold layer 750 may include an insulating material (e.g., an epoxy molding compound).

According to the present embodiments, the plurality of upper semiconductor chips 700 may be mounted on the first surface 600a of the lower semiconductor chip 600, and the mold layer 240 may be disposed on the second surface 600b of the lower semiconductor chip 600. The mold layer 240 may include the insulating material of which the coefficient of thermal expansion is greater than that of the lower semiconductor chip 600, thereby reducing warpage of the lower semiconductor chip 600 which may be caused by structural imbalance between the lower semiconductor chip 600 and the plurality of upper semiconductor chips 700. The mold layer 240 may include the fillers (e.g., silica), and thus the coefficient of thermal expansion of the mold layer 240 may be easily adjusted. As a result, the warpage of the lower semiconductor chip 600 may be easily adjusted.

Figure 21:
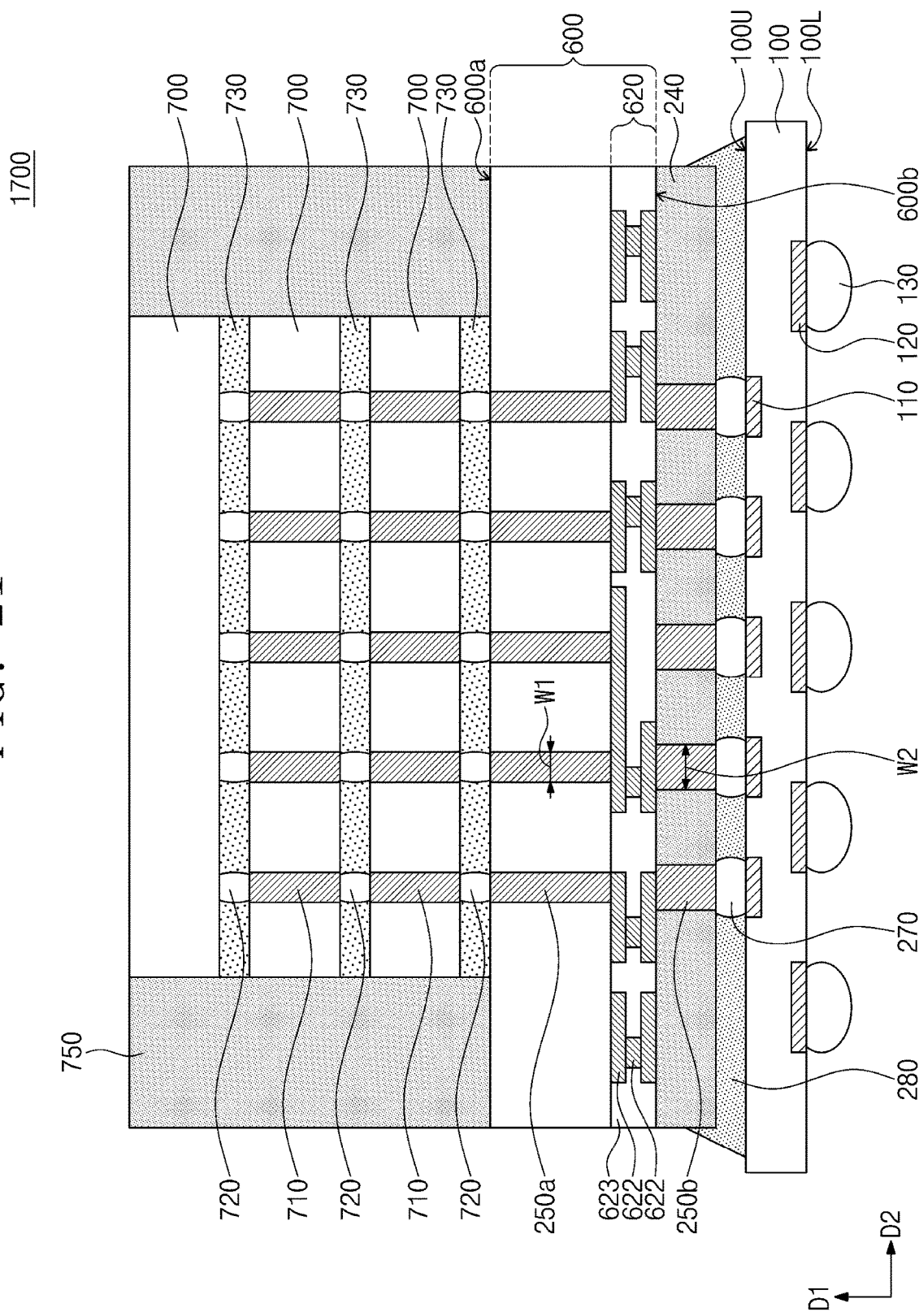
FIG. 21 is a cross-sectional view illustrating a semiconductor package according to some embodiments of the inventive concepts.

FIG. 21 is a cross-sectional view illustrating a semiconductor package 1700 according to some embodiments of the inventive concepts. Hereinafter, differences between the semiconductor package 1700 and the semiconductor package 1600 described with reference to FIG. 20 will be mainly described for the purpose of ease and convenience in explanation.

Referring to FIG. 21, the lower semiconductor chip 600 may include a lower interconnection layer 620 adjacent to the second surface 600b. The lower interconnection layer 620 may include lower metal interconnection lines 622 adjacent to the second surface 600b, and a lower interconnection insulating layer 623 covering the lower metal interconnection lines 622. The lower semiconductor chip 600 may include a circuit layer (not shown) adjacent to the first surface 600a.

A plurality of first through-electrodes 250a may be disposed in the lower semiconductor chip 600. Each of the plurality of first through-electrodes 250a may penetrate the lower semiconductor chip 600 so as to be connected to a corresponding one of the lower metal interconnection lines 622. A plurality of second through-electrodes 250b may be disposed in the mold layer 240. Each of the plurality of second through-electrodes 250b may penetrate the mold layer 240 so as to be connected to a corresponding one of the lower metal interconnection lines 622. The lower interconnection layer 620 may be disposed between the plurality of first through-electrodes 250a and the plurality of second through-electrodes 250b. The plurality of first through-electrodes 250a may be connected to the plurality of second through-electrodes 250b through the lower interconnection layer 620. Each of the plurality of first through-electrodes 250a may vertically overlap a corresponding one of the plurality of second through-electrodes 250b. However, the present invention is not limited thereto. In an exemplary embodiment, at least one of the plurality of second through-electrodes 250b does not vertically overlap its corresponding one of the plurality of first through-electrodes 250a.

The plurality of first through-electrodes 250a may be connected to the upper bumps 720. The lowermost upper semiconductor chip 700 may be electrically connected to the lower semiconductor chip 600 via those connections between the plurality of first through-electrodes 250a and the upper bumps 720. The plurality of upper semiconductor chips 700 may be electrically connected to the lower substrate 100 through the through-vias 710, the upper bumps 720, the plurality of first through-electrodes 250a, the lower metal interconnection lines 622, the plurality of second through-electrodes 250b, and the plurality of bumps 270.

Except for the differences as described above, other components and features of the semiconductor package 1700 according to the present embodiments may be substantially the same as corresponding components and features of the semiconductor package 1600 described with reference to FIG. 20.

According to the embodiments of the inventive concepts, the plurality of semiconductor chips may be mounted on the first surface of the upper substrate, and the mold layer may be disposed on the second surface of the upper substrate. The mold layer may include the insulating material of which the coefficient of thermal expansion is greater than that of the upper substrate, and thus warpage of the semiconductor package may be reduced. The mold layer may include the fillers (e.g., silica), and thus the coefficient of thermal expansion of the mold layer may be easily adjusted. Therefore, the warpage of the semiconductor package may be easily adjusted.

Furthermore, the buffer layer may be disposed on the second surface of the upper substrate, and the plurality of bumps may be disposed on the buffer layer so as to be spaced apart from the mold layer. The buffer layer may reduce stress applied to the plurality of bumps.

As a result, the warpage may be easily controlled, and the semiconductor package with excellent reliability may be provided.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   an upper substrate having a first surface and a second surface which are opposite to each other;
   a semiconductor chip on the first surface of the upper substrate;
   a buffer layer on the second surface of the upper substrate;
   a mold layer between the second surface of the upper substrate and the buffer layer;
   a plurality of through-electrodes penetrating the upper substrate and the mold layer;
   an interconnection layer between the first surface of the upper substrate and the semiconductor chip and configured to electrically connect the semiconductor chip to the plurality of through-electrodes, wherein the interconnection layer contacts the plurality of through-electrodes;
a plurality of bumps disposed on the buffer layer, spaced apart from the mold layer, and electrically connected to the plurality of through-electrodes, wherein the mold layer includes an insulating material of which a coefficient of thermal expansion is greater than that of the upper substrate; and
an insulating layer between the second surface of the upper substrate and the mold layer,
wherein each of the plurality of through-electrodes further penetrates the insulating layer, and
wherein a thickness in a first direction of the mold layer is less than a thickness in the first direction of the upper substrate, and the first direction is perpendicular to the first surface of the upper substrate.

2. The semiconductor package of claim 1, wherein the mold layer includes silica.

3. The semiconductor package of claim 1, further comprising:
an insulating liner covering a sidewall of a first portion of each of the plurality of through-electrodes,
wherein the first portion of each of the plurality of through-electrodes penetrates the upper substrate.

4. The semiconductor package of claim 3, wherein the insulating liner further covers a sidewall of a second portion of each of the plurality of through-electrodes, and
wherein the second portion of each of the plurality of through-electrodes penetrates the mold layer.

5. The semiconductor package of claim 4, wherein the insulating liner further covers a sidewall of a third portion of each of the plurality of through-electrodes.

6. The semiconductor package of claim 1, wherein a thickness in the first direction of the insulating layer is less than the thickness of the mold layer.

7. The semiconductor package of claim 1, wherein the buffer layer includes a first surface that is in contact with the mold layer, and a second surface opposite to the first surface of the buffer layer,
wherein each of the plurality of bumps includes a head portion and a pillar portion,
wherein the pillar portion extends from the head portion into the buffer layer and is connected to a corresponding through-electrode of the plurality of through-electrodes, and
wherein the head portion is connected to the pillar portion and is disposed on the second surface of the buffer layer.

8. The semiconductor package of claim 7, further comprising:
a plurality of conductive pads that are buried in the buffer layer and are adjacent to the first surface of the buffer layer,
wherein the pillar portion of each of the plurality of bumps is connected to a corresponding through-electrode through a corresponding conductive pad of the plurality of conductive pads.

9. The semiconductor package of claim 8, wherein a portion of the buffer layer is disposed horizontally between the plurality of conductive pads and is in contact with the mold layer.

10. The semiconductor package of claim 7, further comprising:
a redistribution layer disposed between the mold layer and the buffer layer,
wherein the redistribution layer comprises a plurality of redistribution patterns, and
wherein each of the plurality of bumps is connected to a corresponding through-electrode through at least one redistribution pattern of the plurality of redistribution patterns.

11. The semiconductor package of claim 7, wherein the pillar portion of each of the plurality of bumps is in contact with a corresponding through-electrode of the plurality of through-electrodes.

12. The semiconductor package of claim 1, wherein each of the plurality of through-electrodes comprises:
a first through-electrode penetrating the upper substrate; and
a second through-electrode penetrating the mold layer,
wherein the first through-electrode has a first width in a first direction parallel to the first surface of the upper substrate,
wherein the second through-electrode has a second width in the first direction, and
wherein the second width of the second through-electrode is greater than the first width of the first through-electrode.

13. The semiconductor package of claim 12, wherein the first through-electrode and the second through-electrode overlap each other in a direction perpendicular to the first surface of the upper substrate.

14. The semiconductor package of claim 12, wherein the first through-electrode is connected to a corresponding metal interconnection line of a plurality of metal interconnection lines in the interconnection layer, and
wherein the second through-electrode is connected to a corresponding bump of the plurality of bumps.

15. The semiconductor package of claim 1, wherein the semiconductor chip is electrically connected to the plurality of through-electrodes through a plurality of metal interconnection lines in the interconnection layer.

16. The semiconductor package of claim 1, further comprising:
an upper mold layer covering the semiconductor chip on the first surface of the upper substrate.

17. The semiconductor package of claim 1, further comprising:
a lower substrate spaced apart from the second surface of the upper substrate with the mold layer, the buffer layer and the plurality of bumps interposed therebetween,
wherein the lower substrate comprises a plurality of lower substrate pads, and
wherein the plurality of bumps are connected to the plurality of lower substrate pads.

18. The semiconductor package of claim 17, further comprising:
a heat dissipation structure disposed on the lower substrate to form a space between the heat dissipation structure and the lower substrate,
wherein the semiconductor chip, the interconnection layer, the upper substrate, the mold layer, the buffer layer, the plurality of bumps and the plurality of through-electrodes are disposed inside the space between the heat dissipation structure and the lower substrate.

19. A semiconductor package comprising:

an upper substrate on a lower substrate, the upper substrate having a first surface and a second surface which are opposite to each other;

a plurality of semiconductor chips mounted on the first surface of the upper substrate;

an interconnection layer between the first surface of the upper substrate and the plurality of semiconductor chips, the plurality of semiconductor chips being connected to a plurality of metal interconnection lines in the interconnection layer;

a mold layer between the second surface of the upper substrate and the lower substrate;

an insulating layer between the second surface of the upper substrate and the mold layer;

a buffer layer between the mold layer and the lower substrate, wherein the buffer layer includes a third surface that is in contact with the mold layer and a fourth surface opposite to the third surface of the buffer layer; a plurality of bumps disposed between the buffer layer and the lower substrate and connected to the lower substrate;

a plurality of through-electrodes penetrating the upper substrate, the insulating layer, and the mold layer; and conductive pads in the buffer layer and adjacent the third surface of the buffer layer, wherein each of the plurality of through-electrodes is connected to a corresponding one of the conductive pads, wherein the interconnection layer contacts the plurality of through-electrodes, wherein each of the plurality of bumps includes a head portion and a pillar portion, wherein the pillar portion extends from the head portion into the buffer layer and is connected to a corresponding one of the conductive pads, wherein the head portion is connected to the pillar portion and is disposed on the fourth surface of the buffer layer, wherein the mold layer includes an insulating material of which a coefficient of thermal expansion is greater than that of the upper substrate, and wherein a thickness in a first direction of the mold layer is less than a thickness in the first direction of the upper substrate, and the first direction is perpendicular to the first surface of the upper substrate.

* * * * *